(12) United States Patent
Lee

(10) Patent No.: US 10,499,515 B2
(45) Date of Patent: Dec. 3, 2019

(54) ELECTRONIC DEVICE

(71) Applicant: Samsung Display Co., Ltd., Yongin-si, Gyeonggi-do (KR)

(72) Inventor: Sangwol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/879,932

(22) Filed: Jan. 25, 2018

(65) Prior Publication Data
US 2018/0343754 A1    Nov. 29, 2018

(30) Foreign Application Priority Data

May 26, 2017   (KR) .......................... 10-2017-0065582

(51) Int. Cl.
*H05K 5/00*   (2006.01)
*H05K 5/02*   (2006.01)
(Continued)

(52) U.S. Cl.
CPC .......... *H05K 5/0017* (2013.01); *G09F 9/301* (2013.01); *H05K 1/028* (2013.01); *H05K 1/0283* (2013.01); *H05K 5/0226* (2013.01)

(58) Field of Classification Search
CPC ...... G06F 1/162; G06F 1/1622; G06F 1/1649; G06F 1/1626; G06F 1/1654; G06F 1/181; G06F 2200/1638; H05K 1/0203; H05K 2201/066; H05K 7/205; H05K 2201/10393; H05K 7/2039; H05K 7/20418; H05K 7/20427; H05K 7/20436; H05K 7/20445; H05K 7/20454; H05K 7/20463; H05K 7/20472; H05K 7/20481; H05K 7/2049; H05K 7/20509; H05K 7/20518; H05K 7/20854; H05K 7/20863; H05K 7/209; H05K 7/20909; H05K 7/20963; H05K 7/20972; H05K 2201/05; H05K 2201/10681; H05K 1/0277; H05K 1/028; H05K 1/0283; H05K 1/147; H05K 1/189;
(Continued)

(56) References Cited

U.S. PATENT DOCUMENTS

D585,444 S    1/2009  Verschoor
7,559,163 B2 *  7/2009  Ofuji ...................... G03B 21/58
                                                    160/265
(Continued)

FOREIGN PATENT DOCUMENTS

KR    10-2012-0079493 A    7/2012
KR       10-1227644 B1    1/2013
KR    10-2014-0054498 A    5/2014

*Primary Examiner* — Pete T Lee
(74) *Attorney, Agent, or Firm* — Lewis Roca Rothgerber Christie LLP

(57) ABSTRACT

An electronic device may include a flexible display member, a fastening member overlapping the display member in a plan view, a housing unit including a first case member and a second case member configured to contain respective opposite portions of the display member, and a hinge unit including a body member coupled to the fastening member to be rotatable in the plan view, a first moving member connecting a portion of the body member to the first case member, and a second moving member connecting an opposite portion of the body member to the second case member.

20 Claims, 24 Drawing Sheets

(51) Int. Cl.
*H05K 1/02* (2006.01)
*G09F 9/30* (2006.01)

(58) Field of Classification Search
CPC ....... H05K 2201/051; H05K 2201/052; H05K 2201/053; H05K 2201/055; H05K 2201/056; H05K 2201/057; H05K 2201/058; H05K 1/118; H05K 1/148; H05K 3/4691; H01L 23/40; H01L 23/4006; H04M 1/021; H04M 1/0212; H04M 1/0216; H04M 1/0227
See application file for complete search history.

(56) References Cited

U.S. PATENT DOCUMENTS

| | | | |
|---|---|---|---|
| 2012/0162876 A1 | 6/2012 | Kim | |
| 2014/0247544 A1* | 9/2014 | Ryu | ........................ G09F 11/18 361/679.01 |

* cited by examiner

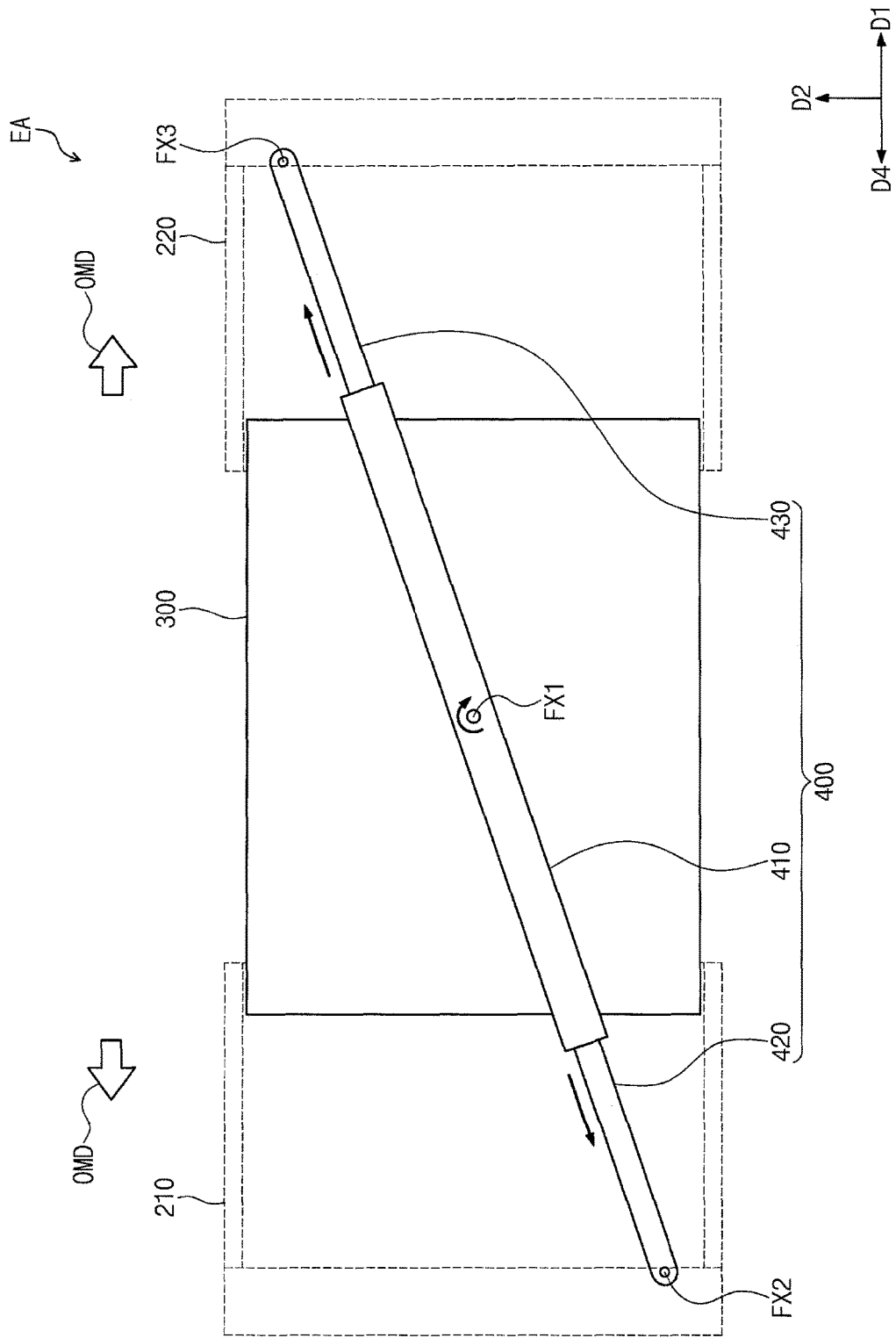

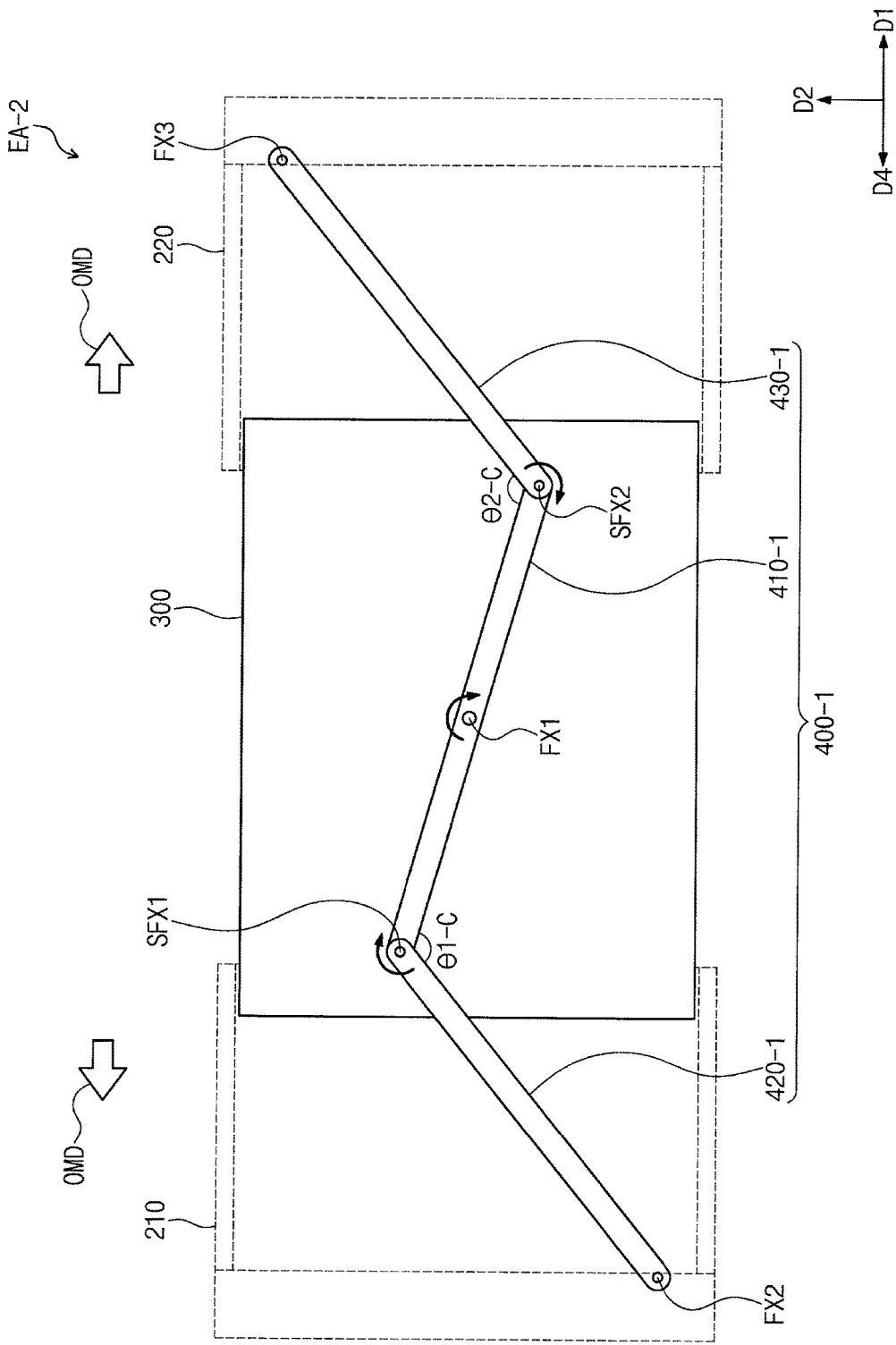

ELECTRONIC DEVICE

CROSS-REFERENCE TO RELATED APPLICATIONS

This application claims priority to, and the benefit of, Korean Patent Application No. 10-2017-0065582, filed on May 26, 2017, in the Korean Intellectual Property Office, the entire contents of which are hereby incorporated by reference.

BACKGROUND

1. Field

The present disclosure relates to an electronic device configured to allow for a sliding operation.

2. Description of the Related Art

An electronic device provides an active region, which is electrically activated, to a user. The user can obtain information from an image displayed on the active region, or can input a signal for controlling the electronic device to the active region.

In general, the electronic device has a given screen size for displaying image information, or for sensing an external input signal. An electronic device with a bendable or flexible display panel and/or touch panel is recently being developed. Unlike a flat panel, the flexible panel can be folded, rolled, or bent like paper. Due to its deformable property, the flexible panel can be portably carried by the user, without similar limitations corresponding to screen size, as with the conventional panel, and thus, it is possible to improve the user's convenience.

SUMMARY

Some embodiments of the inventive concept provide an electronic device configured to allow for an easy sliding operation.

According to some embodiments of the inventive concept, an electronic device may include a flexible display member, a fastening member overlapping the display member in a plan view, a housing unit including a first case member and a second case member configured to contain respective opposite portions of the display member, and a hinge unit including a body member coupled to the fastening member to be rotatable in the plan view, a first moving member connecting a portion of the body member to the first case member, and a second moving member connecting an opposite portion of the body member to the second case member.

The display member may be configured to display an image on a first region in a first mode, and on a second region in a second mode, wherein the first mode and the second mode are respectively performed in different operation periods, and wherein the first region and the second region are different from each other in their areas.

When the electronic device is changed from the first mode to the second mode, or when the electronic device is changed from the second mode to the first mode, the body member may be configured to perform a rotational motion in the plan view, and each of the first case member and the second case member may be configured to perform a linear motion in the plan view.

The first case member and the second case member may be configured to perform symmetric motions.

When the electronic device is changed from the first mode to the second mode, or when the electronic device is changed from the second mode to the first mode, each of the first moving member and the second moving member may be configured to perform a linear motion in a direction that crosses a direction of the linear motion of each of the first case member and the second case member in the plan view.

The body member may be a rod-shaped structure extending in an extending direction, and the direction of the linear motion of each of the first moving member and the second moving member may be parallel to the extending direction.

The linear motion of each of the first moving member and the second moving member may be configured to be performed in a stepwise manner.

The body member may have a length that is extendable depending on an operation mode of the electronic device.

The electronic device may further include a first coupling member coupling the body member to the fastening member, a second coupling member coupling the first moving member to the first case member, and a third coupling member coupling the second moving member to the second case member, wherein the body member has a rotating axis passing through the first coupling member.

The electronic device may further include a first sub-coupling member coupling the first moving member to the body member, and a second sub-coupling member coupling the second moving member to the body member, wherein, in the plan view, the first sub-coupling member and the second sub-coupling member are configured to perform respective motions depending on whether the electronic device is in the first mode or in the second mode.

The motions of the first sub-coupling member and the second sub-coupling member may be performed to respectively change an angle between the first moving member and the body member at the first sub-coupling member and an angle between the second moving member and the body member at the second sub-coupling member.

The hinge unit may include a first hinge unit and a second hinge unit, each of which is coupled to the fastening member, and which are arranged to cross each other, and the first hinge unit and the second hinge unit may have respective body members that are configured to perform rotational motions about a common axis.

According to some embodiments of the inventive concept, an electronic device may include an electronic panel configured to activate a first region in a first mode and a second region in a second mode, the second region having an area that is larger than that of the first region, a fastening member overlapping the electronic panel in a plan view, a housing unit configured to contain the electronic panel and the fastening member, and including a first case member and a second case member, each of which is configured to perform a linear motion, and a hinge unit including a body member, a first moving member, and a second moving member, the body member being fastened to the fastening member and being configured to perform a rotational motion in the plan view, the first moving member connecting a portion of the body member to the first case member, and a second moving member connecting an opposite portion of the body member to the second case member, wherein the first case member and the second case member are configured such that the linear motions thereof are symmetric about the fastening member in the plan view.

When the electronic device is changed from the first mode to the second mode, the body member may be configured to perform a rotational motion in a clockwise direction in the plan view, the first moving member may be configured to perform a linear motion in an extension direction of the body member, and the second moving member may be configured to perform a linear motion in a direction that is opposite to the extension direction.

The extension direction of the body member may be at an angle to a direction of the linear motion of each of the first case member and the second case member.

The electronic device may further include a first coupling member coupling the body member to the fastening member, a second coupling member coupling the body member to the first case member, and a third coupling member coupling the body member to the second case member, wherein the first coupling member includes a gear portion having a saw-tooth structure, and wherein each of the first moving member and the second moving member includes protruding portions that are configured to be fittingly engaged with the gear portion.

The electronic device may further include a first sub-coupling member coupling the portion of the body member to the first moving member, and a second sub-coupling member coupling the opposite portion of the body member to the second moving member, wherein, in the plan view, a position of each of the first sub-coupling member and the second sub-coupling member in the first mode is different from that in the second mode.

In the first mode, all of the fastening member, the first case member, and the second case member may overlap each other in the first mode in the plan view, and the first region may overlap all of the fastening member, the first case member, and the second case member in the plan view.

According to some embodiments of the inventive concept, an electronic device may include a flexible electronic panel, a fastening member overlapping the electronic panel in a plan view, a housing unit including a first case member and a second case member that are configured to contain respective opposite portions of the electronic panel, and a hinge unit including a body member, a first moving member, and a second moving member, wherein the body member is coupled to the fastening member to be rotatable in the plan view, the first moving member is slidably coupled to a portion of the body member and is fixedly coupled to the first case member, and the second moving member is slidably coupled to an opposite portion of the body member and is fixedly coupled to the second case member.

The body member may be extendable in an extension direction, and each of the first moving member and the second moving member may be configured to perform a linear motion in the extension direction.

BRIEF DESCRIPTION OF THE DRAWINGS

Embodiments will be more clearly understood from the following brief description taken in conjunction with the accompanying drawings. The accompanying drawings represent non-limiting embodiments as described herein.

FIGS. 5A and 5B are plan views illustrating some components of an electronic device according to some embodiments of the inventive concept.

FIGS. 7A and 7B are plan views illustrating some components of an electronic device according to some embodiments of the inventive concept.

Figure 1A:
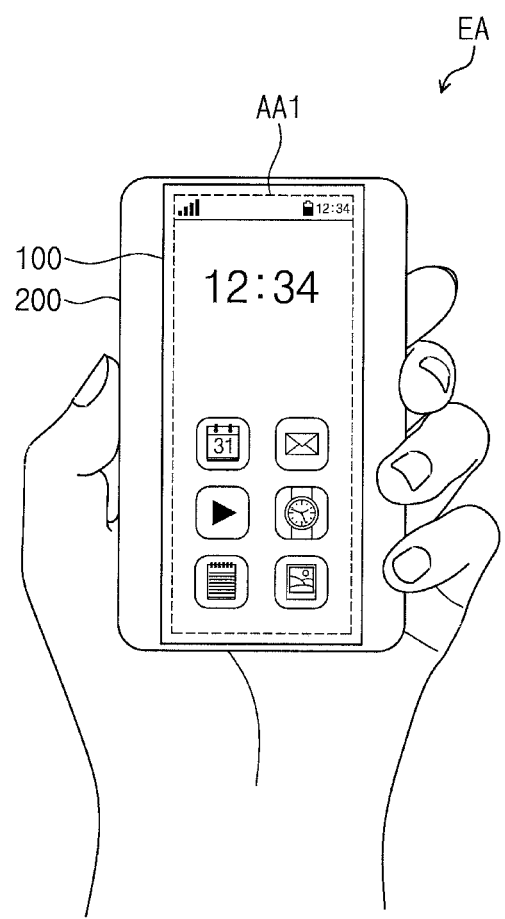
FIGS. 1A and 1B are diagrams illustrating two different usage states of an electronic device according to some embodiments of the inventive concept.

It should be noted that these figures are intended to illustrate the general characteristics of methods, structures, and/or materials utilized in certain embodiments, and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous details are set forth to provide a thorough understanding of various embodiments. It is apparent, however, that various embodiments may be practiced without these particular details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein; the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a particular process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, particular structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
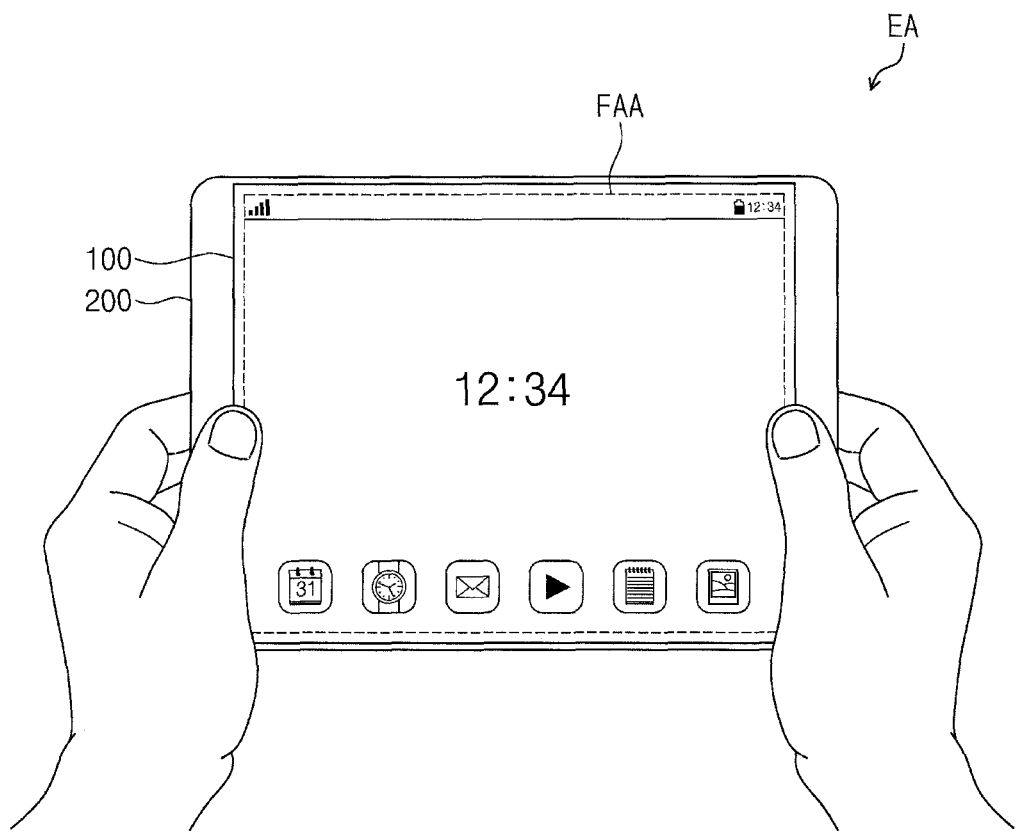

FIGS. 1A and 1B are diagrams illustrating two different usage states of an electronic device according to some embodiments of the inventive concept. For example, FIG. 1A illustrates a usage state of an electronic device EA in a first mode, and FIG. 1B illustrates a usage state of the electronic device EA in a second mode.

In the electronic device EA, the first mode and the second mode may be two different modes that are respectively performed in different operation periods, and depending on whether the electronic device EA is in the first mode or the second mode, the electronic device EA may provide one of different active regions. The active region may be a region of the electronic device EA that is activated by electrical signals applied thereto. As shown in FIGS. 1A and 1B, the electronic device EA may provide an active region AA1 when it is in the first mode, and may provide an active region FAA, which has a size that is different from that of the active region AA1, when it is in the second mode.

The active regions may be variously activated depending on the configuration or operation mode of the electronic device EA. For example, the active region may be used to display an image. In this case, the electronic device EA may include a pixel array provided in the active region.

The pixel array may include a thin-film transistor and a display device. The display device may be a liquid crystal capacitor, an organic light emitting diode, an electrophoresis device, or an electrowetting device, but the inventive concept is not limited thereto.

In certain embodiments, the active region may be used to sense or detect an externally applied touch input. The touch input may include contact-type and/or proximity-type touches, and may include input signals to be applied in various manners including optical, conductive, and pressure touches. In this case, the electronic device EA may include a touch array provided in the active region.

Alternatively, the active region may be used to both display an image and to sense a touch input to be applied from the outside. In this case, the electronic device EA may include both a pixel array and a touch array that are provided in the active region.

However, the inventive concept is not limited to the above examples, and the active region FAA may be activated in various manners to realize various functions.

For example, as shown in FIG. 1A, the electronic device EA may provide the first active region AA1 when it is in the first mode. The first active region AA1 may have a relatively small area. For example, as shown in FIG. 1A, the electronic device EA in the first mode can be manipulated by a single hand of a user, and thus, the electronic device EA in this mode may have high portability.

By contrast, as shown in FIG. 1B, the electronic device EA may provide the second active region FAA when it is in the second mode. The second active region FAA may have a relatively large area. This may allow for a user to use an increased area of the electronic device EA, and thus, the electronic device EA in this mode may have high expandability.

According to some embodiments of the inventive concept, the electronic device EA may be configured to have a shape that can be variously changed depending on its operation mode. This may allow the electronic device EA to have a shape changed according to the intent of the user.

Figure 2:
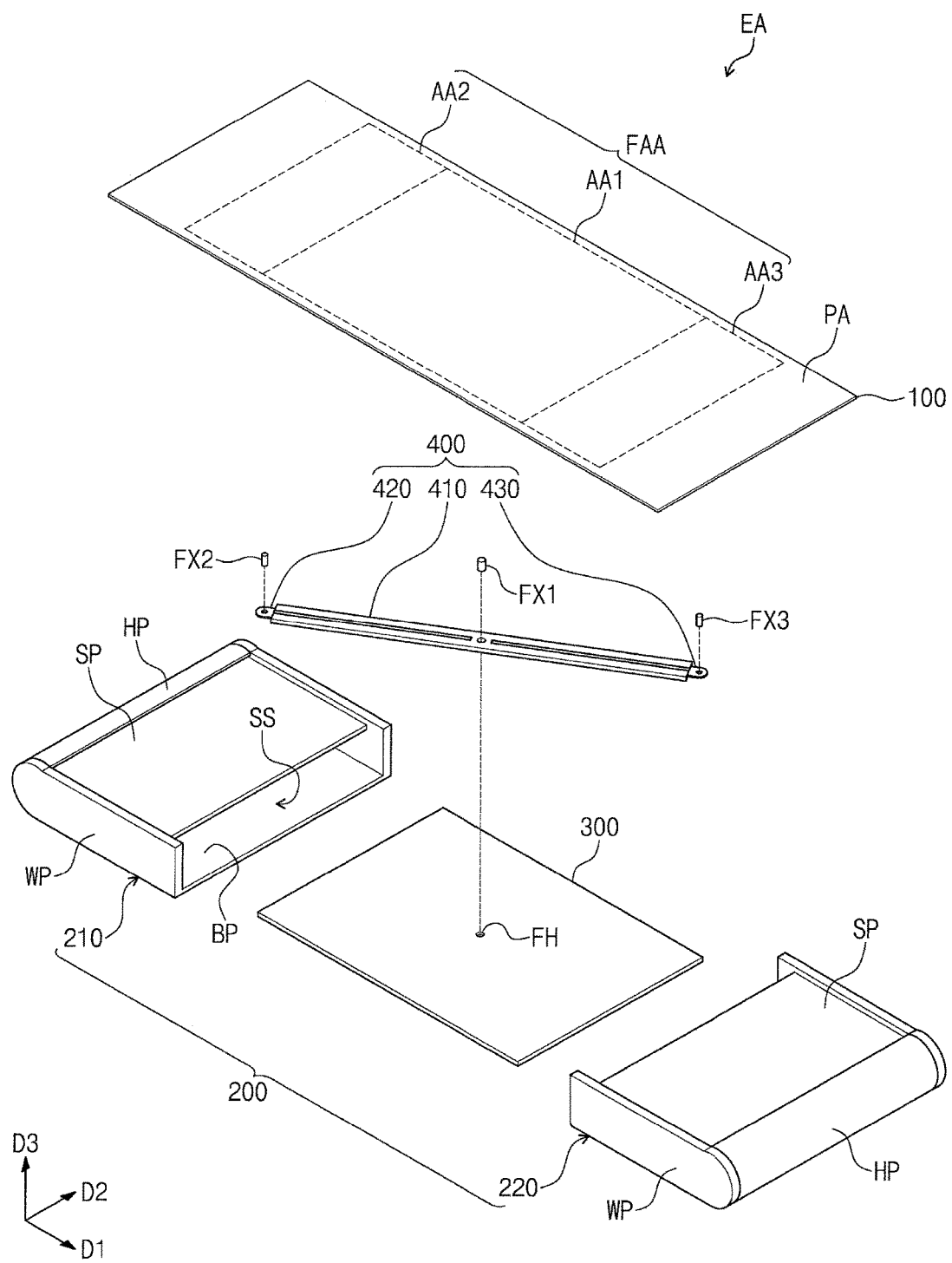
FIG. 2 is an exploded perspective view illustrating an electronic device according to some embodiments of the inventive concept.

FIG. 2 is an exploded perspective view illustrating an electronic device according to some embodiments of the inventive concept. For illustration purposes, in FIG. 2, an exploded perspective view of the electronic device EA of FIGS. 1A and 1B is illustrated. Hereinafter, the electronic device EA will be described in more detail with reference to FIG. 2.

As shown in FIG. 2, the electronic device EA may include an electronic panel/display member/display panel 100, a housing unit 200, a fastening member 300, and a hinge unit 400.

The electronic panel 100 may be a flexible panel. According to its operation mode, the electronic panel 100 may be contained in the housing unit 200. Here, a portion of the electronic panel 100 may be bent with a variable curvature. That is, the electronic panel 100 may be a flexible panel, which can have its shape variously changed when it is contained in the housing unit 200, and which can be easily restored to its initial shape.

The electronic panel 100 may be divided into the active region FAA and a peripheral region when viewed in a top plan view corresponding to a plane that is parallel to a first direction D1 and a second direction D2. The active region FAA may be configured to be activated when an electrical signal is applied thereto.

The electronic panel 100 may be provided in various forms. For example, the electronic panel 100 may be a display panel including a plurality of pixels. Each of the pixels may include at least one thin-film transistor and at least one display device. The display device may be one of an electrophoresis device, an electrowetting device, a liquid crystal capacitor, and an organic light emitting device, but the inventive concept is not limited thereto.

In certain embodiments, the electronic panel 100 may be a sensor panel including a plurality of sensors. The sensors may be configured to sense an input, which is externally applied, and may be configured to then produce an electrical signal corresponding to the input. The input may be applied to the sensor panel in various manners. For example, the electronic panel 100 may include at least one of various sensing panels including touch-sensing, light-sensing, and pressure-sensing panels, which are respectively configured to sense a touch event, light, and pressure applied from the outside, but the inventive concept is not limited thereto.

In the present embodiment, an example in which the electronic panel 100 is a display panel will be described. However, the inventive concept is not limited thereto, and according to functions suitable for the electronic device, the electronic panel 100 may include various panels, as described above.

The electronic panel 100 (hereinafter, in the present embodiment, a display member) may be configured to display an image on the active region FAA. A user may receive information through the image displayed on the active region FAA. In addition, the electronic panel 100 may also be configured to detect or sense an external touch input applied through the active region FAA. A user's input signal may be provided to the electronic panel 100 through the active region FAA.

The active region FAA may be divided into a first region AA1, a second region AA2, and a third region AA3, when viewed in a top plan view. The first, second, and third regions AA1, AA2, and AA3 may be independently controlled.

For example, the first, second, and third regions AA1, AA2, and AA3 may be activated during different operation periods. Alternatively, the first, second, and third regions AA1, AA2, and AA3 may be activated during the same operation period.

In some embodiments, the first, second, and third regions AA1, AA2, and AA3 may be configured to display different images during the same operation period. In certain embodiments, the first, second, and third regions AA1, AA2, and AA3 may be configured to display three different, but relevant/related, parts of a single image during the same operation period.

Referring to FIG. 1A, the first region AA1 may be defined as an active region (hereinafter, a first active region) of the electronic device in the first mode. In the first mode, the first region AA1 may be selectively activated while the second and third regions AA2 and AA3 are not activated. The second and third regions AA2 and AA3 may be veiled by the housing unit 200, and thus may not be exposed to, or visible from, the outside.

Referring to FIG. 1B, the active region in the second mode may be defined as the entire active region (hereinafter, a second active region FAA) of the electronic panel 100. That is, the second active region FAA may be a region including the first, second, and third regions AA1, AA2, and AA3. In the second mode, all of the first, second, and third regions AA1, AA2, and AA3 may be activated.

All of the first, second, and third regions AA1, AA2, and AA3 may be positioned outside the housing unit 200, thereby being exposed to the outside, and thus, they may be visible to a user. The electronic device EA may have a larger active region in the second mode than in the first mode.

As shown in FIG. 2, the peripheral region PA may be adjacent to the second active region FAA. The peripheral region PA may be provided to enclose or partly surround the second active region FAA. The peripheral region PA may not be visible to a user in the first mode or in the second mode. A driving circuit, which is configured to control the second active region FAA, may be provided in the peripheral region PA.

The housing unit 200 may include a first case member 210 and a second case member 220. The first and second case members 210 and 220 may be provided to face each other in a first direction D1.

Each of the first and second case members 210 and 220 may include a bottom portion BP, a wall portion WP, a supporting portion SP, and a handle portion HP. The bottom portion BP may be provided to be parallel to both of the first and second directions D1 and D2.

Each of the wall portion WP and the handle portion HP may be connected to the bottom portion BP, and may extend in a direction that is different from that in which the bottom portion BP extends. The wall portion WP and the handle portion HP may define side surfaces of the electronic device EA. The handle portion HP may be graspable by a user to allow the user to change the mode of the electronic device EA from the first mode to the second mode or vice versa.

In the present embodiment, the handle portion HP is illustrated to have a relatively curved shape as compared with the wall portion WP. This may allow for a user to more easily grasp the electronic device EA. However, the inventive concept is not limited to the above examples, and the handle portion HP may be provided in various forms.

The supporting portion SP may be parallel to the bottom portion BP. The supporting portion SP may be configured to support the electronic panel 100 (e.g., a rear surface of the electronic panel 100). The supporting portion SP may be spaced apart from the bottom portion BP, and may be connected to the wall portion WP. The supporting portion SP, the bottom portion BP, and the wall portion WP may be connected to each other to define a suitable space (e.g., a tunnel-shaped empty region extending in the first direction D1).

The supporting portion SP may be spaced apart from the handle portion HP. The electronic panel 100 may include a portion that can be inserted into, or extracted from, each of the first and second case members 210 and 220 through a space between the supporting and handle portions SP and HP spaced apart from each other. Thus, depending on its operation mode, the portion of the electronic panel 100 may be contained in each of the first and second case members 210 and 220 or may be positioned on the supporting portion SP, thereby being exposed to the outside.

The fastening member 300 may be provided to be parallel to both of the first and second directions D1 and D2. The fastening member 300 may be contained in a space that is defined by the housing unit 200. For example, a side portion of the fastening member 300 may be contained in a space that is defined by the supporting portion SP, the wall portion WP, and the bottom portion BP of the first case member 210, and an opposite side portion of the fastening member 300 may be contained in another space that is defined by the supporting portion SP, the wall portion WP, and a bottom portion of the second case member 220.

The hinge unit 400 may be provided between the fastening member 300 and the electronic panel 100. The hinge unit 400 may be coupled to the fastening member 300, and may be contained in the space defined by the housing unit 200 in such a coupled state.

The hinge unit 400 may be coupled to the housing unit 200 and the fastening member 300, and may be used to change a position of the housing unit 200 relative to the fastening member 300 (i.e., to control motion of the housing unit 200). When, in the first mode and the second mode, a shape of the electronic device EA may be changed by an external force, and the hinge unit 400 may be configured to transfer the external force to the housing unit 200.

In detail, the hinge unit 400 may include a body member 410, a first moving member 420, and a second moving member 430. The body member 410 may be a rod-shaped structure extending in a suitable direction. The body member 410 may be coupled to the fastening member 300 by a first coupling member FX1.

Each of the first and second moving members 420 and 430 may be a rod-shaped structure extending in the suitable direction. The first and second moving members 420 and 430 may be spaced apart from each other in the suitable direction, and may be coupled to the body member 410.

The first moving member 420 may be coupled to a side portion of the body member 410, thereby coupling the body member 410 to the first case member 210. The second moving member 430 may be coupled to an opposite side portion of the body member 410, thereby coupling the body member 410 to the second case member 220. In the present specification, the expression "coupled/coupling" may be used to mean that at least two components or parts may be connected to each other in a direct manner or in an indirect manner using an external coupling member.

A variety of coupling ways may be used to couple each of the body member 410, the first moving member 420, and the second moving member 430 to other respective components. For example, the body member 410 may be coupled to the fastening member 300 in a rotatable manner. That is, the body member 410 may be coupled to the fastening member 300 in such a way that it can be rotated in a plane parallel to the first and second directions D1 and D2.

Each of the first and second moving members 420 and 430 may be coupled to the body member 410 in a slidable manner. For example, each of the first and second moving members 420 and 430 may be coupled to the body member 410 in such a way that it is linearly movable in an extension direction of the body member 410.

However, the inventive concept is not limited to the above coupling manners, and each of the body member 410, the first moving member 420, and the second moving member 430 may be coupled to other components in various other manners. This will be described in more detail below.

Figure 3A:
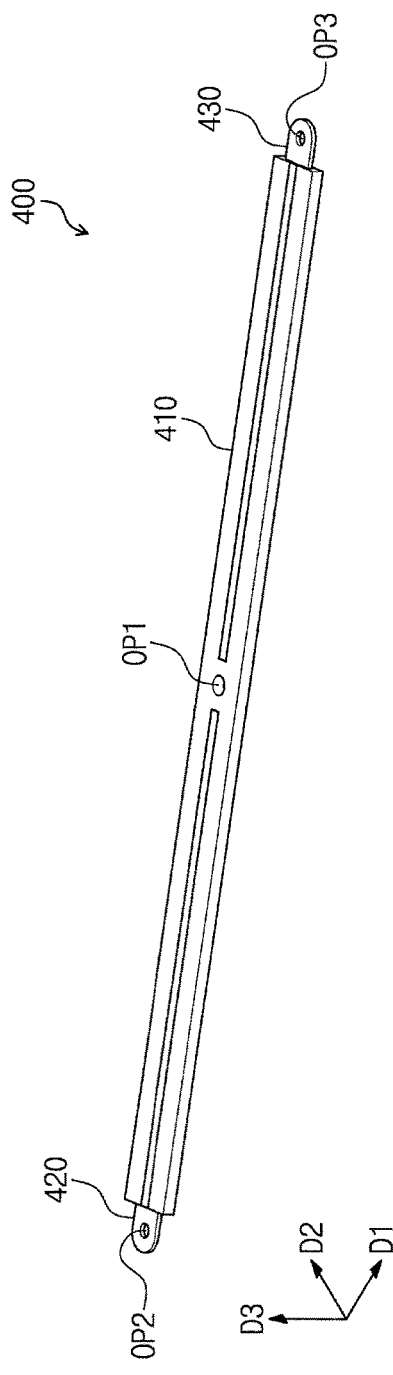
FIGS. 3A and 3B are perspective views illustrating states of a hinge unit depending on its operation mode, according to some embodiments of the inventive concept.
Figure 3B:
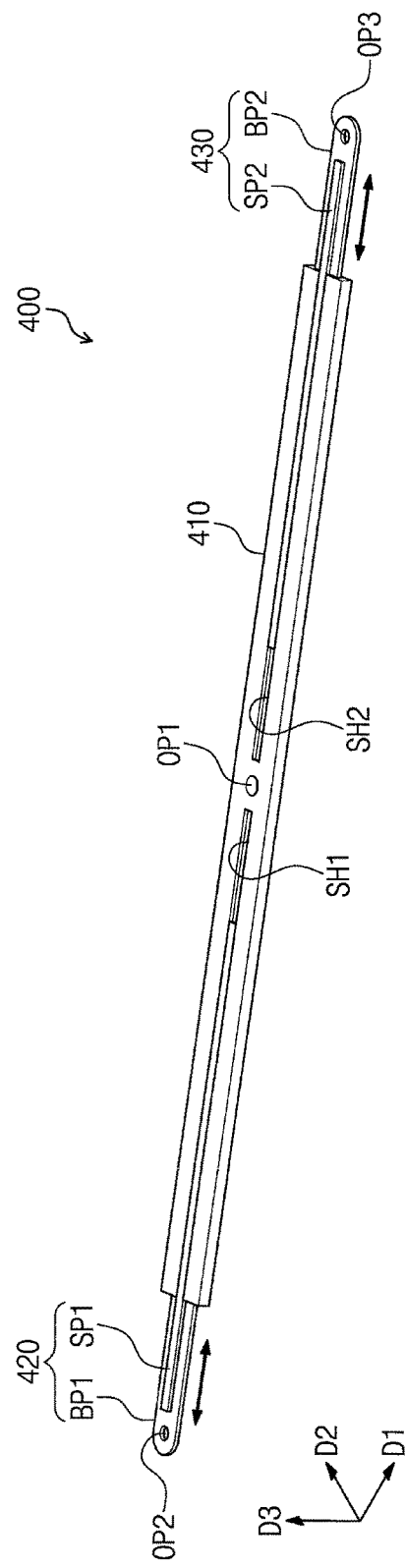

FIGS. 3A and 3B are perspective views illustrating states of a hinge unit depending on its mode, according to some embodiments of the inventive concept. FIG. 3A illustrates a perspective view of the hinge unit 400 in the first mode, and FIG. 3B illustrates a perspective view of the hinge unit 400 in the second mode.

Hereinafter, some embodiments of the inventive concept will be described with reference to FIGS. 3A and 3B. For concise description, an element previously described with reference to FIGS. 1A, 1B, and 2 may be identified by a similar or identical reference number without repeating an overlapping description thereof.

As shown in FIGS. 3A and 3B, the body member 410 may be a rod-shaped structure extending in a direction and having a suitable length. A first sliding hole SH1, a first opening OP1, and a second sliding hole SH2 may be defined in, or by, the body member 410.

The first opening OP1 may be defined between the first sliding hole SH1 and the second sliding hole SH2. The first opening OP1 may be positioned at a center of the body member 410 when viewed in a length direction of the body member 410. The body member 410 may be configured to rotate about the first opening OP1 on a plane that is parallel to the first and second directions D1 and D2.

Each of the first sliding hole SH1 and the second sliding hole SH2 may be a slit-shaped region extending in the length direction of the body member 410. Each of the first sliding hole SH1 and the second sliding hole SH2 may extend to an end of the body member 410.

The body member 410 may be provided to have an internal space when viewed in a sectional view. The internal space of the body member 410 may extend in the length direction of the body member 410. The internal space of the body member 410 may be configured to contain the first moving member 420 and the second moving member 430.

The first and second moving members 420 and 430 may be contained in the internal space of the body member 410 to be linearly movable. The first and second moving members 420 and 430 may be configured to move in a direction that is parallel to the extension direction of the body member 410.

The first moving member 420 may be coupled to the body member 410. In the present embodiment, the first moving member 420 may be inserted into and coupled to the body member 410. In detail, the first moving member 420 may include a first body member portion BP1 and a first sliding portion SP1. The first body member portion BP1 may be inserted into a portion of the internal space of the body member 410 connected to, or in communication with, the first sliding hole SH1.

The first sliding portion SP1 may be inserted into the first sliding hole SH1. The first sliding portion SP1 may have a shape corresponding to that of the first sliding hole SH1. The first sliding portion SP1 may allow the first moving member 420 to be stably moved in a relatively confined direction (e.g., in the extension direction of the body member 410).

A second opening OP2 may be defined in the first moving member 420. The second opening OP2 may be defined at an end portion of the first moving member 420. The first moving member 420 may be coupled to the first case member 210 (e.g., see FIG. 2) through the second opening OP2. Thus, the first moving member 420 may be coupled to the body member 410 through the first sliding hole SH1 and may be coupled to the first case member 210 through the second opening OP2.

The second moving member 430 may include a second body member portion BP2 and a second sliding portion SP2. The second body member portion BP2 may be inserted into a portion of the internal space of the body member 410 connected to the second sliding hole SH2.

The second sliding portion SP2 may be inserted into the second sliding hole SH2. The second sliding portion SP2 may have a shape corresponding to that of the second sliding hole SH2. The second sliding portion SP2 may allow the second moving member 430 to be stably movable in a relatively confined direction (e.g., in the extension direction of the body member 410).

A third opening OP3 may be defined in the second moving member 430. The third opening OP3 may be defined at an end portion of the second moving member 430. The second moving member 430 may be coupled to the second case member 220 (e.g., see FIG. 2) through the third opening OP3. Thus, the second moving member 430 may be coupled to the body member 410 through the second sliding hole SH2, and may be coupled to the second case member 220 through the third opening OP3. Accordingly, when the second case member 220 is moved in a linear motion, the second moving member 430 may move in a corresponding linear motion.

Figure 4A:
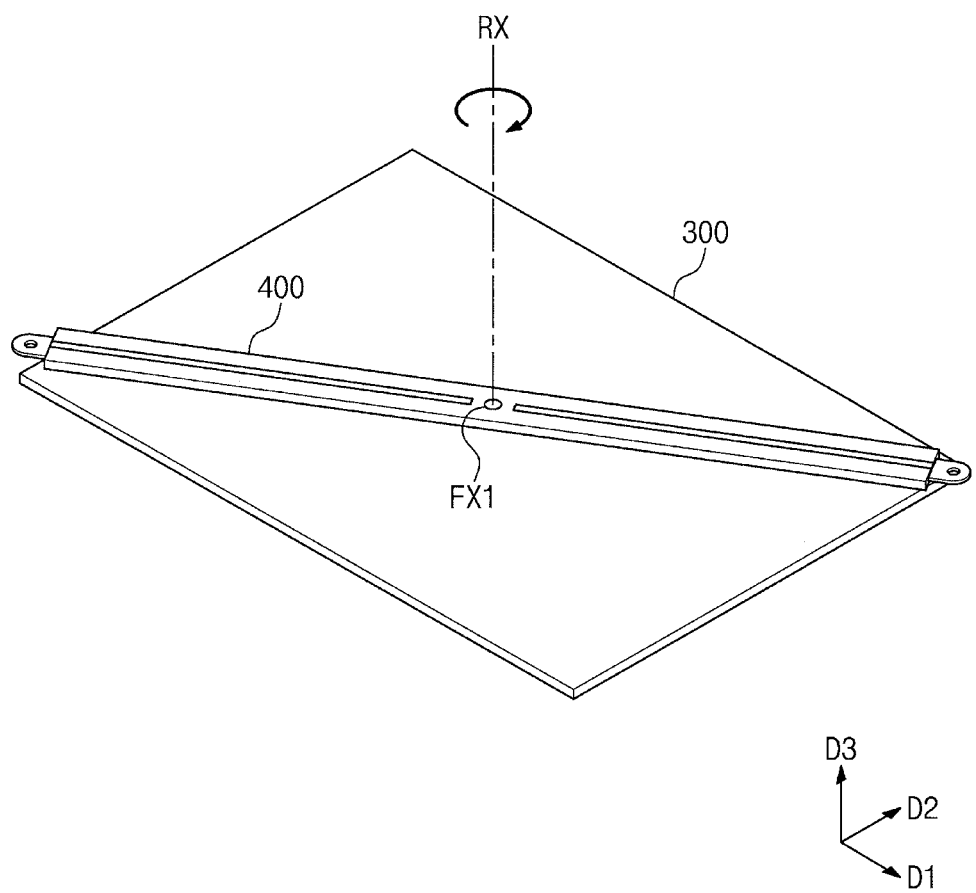
FIGS. 4A and 4B are perspective views illustrating some components of an electronic device according to some embodiments of the inventive concept.
Figure 4B:
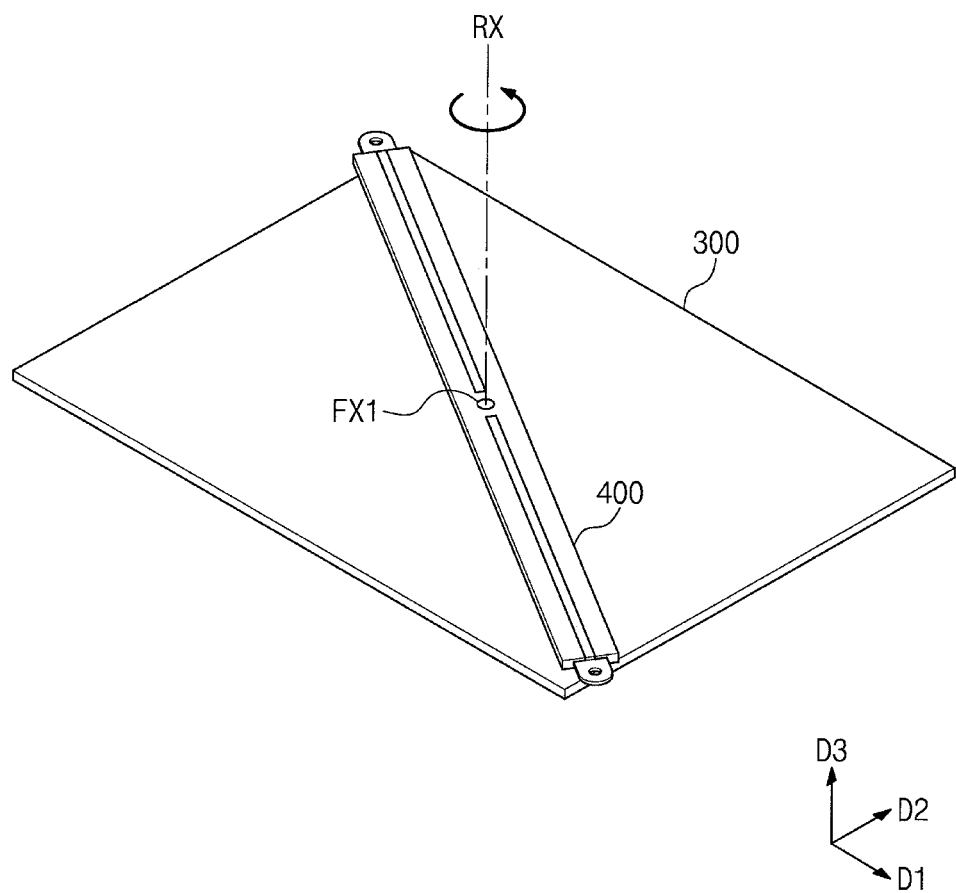

FIGS. 4A and 4B are perspective views illustrating some components of an electronic device according to some embodiments of the inventive concept. FIGS. 4A and 4B illustrate the fastening member 300 and the hinge unit 400 in different modes.

Hereinafter, an electronic device according to some embodiments of the inventive concept will be described with reference to FIGS. 4A and 4B. For concise description, an element previously described with reference to FIGS. 1A, 1B, 2, 3A, and 3B may be identified by a similar or identical reference number without repeating an overlapping description thereof.

As shown in FIGS. 4A and 4B, the hinge unit 400 may be coupled to the fastening member 300 by the first coupling member FX1. Here, the hinge unit 400 may be coupled to the fastening member 300 in such a way that it can be rotated on a plane parallel to the first and second directions D1 and D2.

FIG. 4A illustrates the hinge unit 400 and the fastening member 300 in the first mode. As shown in FIG. 4A, in the first mode, the hinge unit 400 may be provided to extend in a diagonal direction of the fastening member 300. Thereafter, the hinge unit 400 may be rotated in a direction of an arrow shown in FIG. 4A (e.g., in a clockwise direction), and thus, the mode of the electronic device may be changed from the first mode to the second mode.

FIG. 4B illustrates the hinge unit 400 and the fastening member 300 in the second mode. As shown in FIG. 4B, in the second mode, the hinge unit 400 may be provided to extend in a diagonal direction, different from that in the first mode, of the fastening member 300. Thereafter, the hinge unit 400 may be rotated in a direction of an arrow shown in FIG. 4B (e.g., in a counterclockwise direction), and thus, the mode of the electronic device may be changed from the second mode to the first mode.

According to some embodiments of the inventive concept, the hinge unit 400 may be coupled to the fastening member 300 to be rotatable. In other words, the first coupling member FX1 may be configured to allow a center of the hinge unit 400 to be stably fastened to, but rotated on, the fastening member 300. Thus, the hinge unit 400 may be rotated on the fastening member 300 in the clockwise or counterclockwise direction.

According to some embodiments of the inventive concept, the linear motion (e.g., shown in FIGS. 3A and 3B) and the rotational motion (e.g., shown in FIGS. 4A and 4B) of the hinge unit 400 may be used to control a motion or a change in shape of the housing unit 200 (e.g., see FIG. 2) that is connected to the hinge unit 400.

Figure 5A:
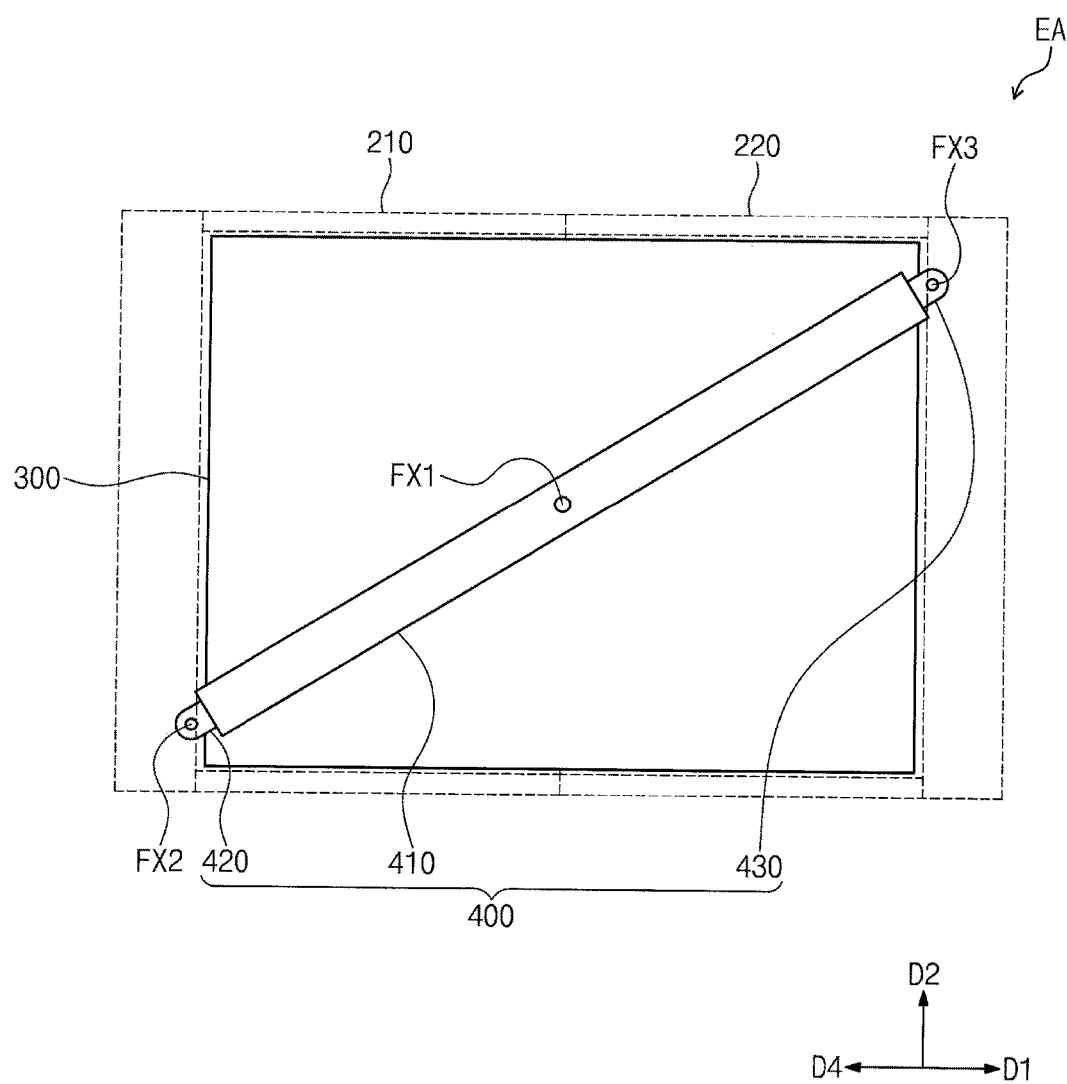

FIGS. 5A and 5B are plan views illustrating some components of an electronic device according to some embodiments of the inventive concept. FIG. 5A illustrates a plan view of the electronic device EA in the first mode, and FIG. 5B illustrates a plan view of the electronic device EA in the second mode.

For example, FIG. 5A illustrates some components of the electronic device EA shown in FIG. 1A, and FIG. 5B illustrates some components of the electronic device EA shown in FIG. 1B. In FIGS. 5A and 5B, for convenience in illustration, the fastening member 300 and the hinge unit 400 are depicted by solid lines, and the first and second case members 210 and 220 are depicted by dotted lines.

Hereinafter, an electronic device according to some embodiments of the inventive concept will be described with reference to FIGS. 5A and 5B. For concise description, an element previously described with reference to FIGS. 1A to 4B may be identified by a similar or identical reference number without repeating an overlapping description thereof.

As shown in FIG. 5A, in the first mode, the first and second case members 210 and 220 may be provided to be in contact with each other. The fastening member 300 may be enclosed by the first and second case members 210 and 220, when viewed in a plan view.

The hinge unit 400 may be provided to extend in a diagonal direction that is non-parallel to both of the first and second directions D1 and D2. For example, the hinge unit 400 may be arranged to have an extension direction that is parallel to the diagonal direction of the fastening member 300.

The first coupling member FX1 may be provided to couple the body member 410 to the fastening member 300. As described above, the body member 410 may be coupled to the fastening member 300 to be rotatable when viewed in a plan view.

In the present embodiment, the first moving member 420 may be coupled to the first case member 210 to be rotatable on the plane parallel to the first and second directions D1 and D2. Here, a rotating axis of the first moving member 420 may pass through a second coupling member FX2.

In the present embodiment, the second moving member 430 may be coupled to the second case member 220 to be rotatable when viewed in a plan view. Here, a rotating axis of the second moving member 430 may pass through a third coupling member FX3.

Thereafter, as shown in FIG. 5B, in the second mode, the first and second case members 210 and 220 may move linearly/may perform a linear motion OMD with respect to the fastening member 300. A direction of the linear motion OMD of the first and second case members 210 and 220 may be a fourth direction D4 that is opposite to the first direction D1, and the first direction D1, respectively.

The first and second case members 210 and 220 may be configured in such a way that the linear motions OMD thereof are performed in a symmetric manner. For example, the linear motion OMD of the second case member 220 in the first direction D1 may be performed to have the same moving distance as that of the linear motion OMD of the first case member 210 in the fourth direction D4.

The linear motions OMD of the first and second case members 210 and 220 with respect to the fastening member 300 may increase a distance between the first and second case members 210 and 220. The hinge unit 400 may be configured to perform a rotational motion and a linear motion, and the rotational and linear motions of the hinge unit 400 may be used for response to the linear motions OMD of the first and second case members 210 and 220.

In detail, in the case where a distance between the first and second case members 210 and 220 is increased in the second mode, the body member 410 may be rotated in a clockwise direction about a rotating axis passing through the first coupling member FX1, and each of the first and second moving members 420 and 430 may perform a linear motion in an outward direction away from the body member 410.

Owing to the linear motion OMD of each of the first and second case members 210 and 220, each of the first and second moving members 420 and 430, which are respectively coupled to the first and second case members 210 and 220, may be extracted outwardly from the body member 410, and thus, a length of the hinge unit 400 may be increased.

The rotational motion of the body member 410, which is coupled to the fastening member 300, may be used to adjust an angle of the hinge unit 400 relative to the first direction D1. Accordingly, it may be possible to stably control the linear motion OMD of the first and second case members 210 and 220.

Furthermore, in the present embodiment, a moving distance in the linear motion of the first moving member 420 may be substantially the same as that in the linear motion of the second moving member 430. Accordingly, the symmetry in the linear motions OMD of the first and second case members 210 and 220 can be more easily achieved.

Figure 6A:
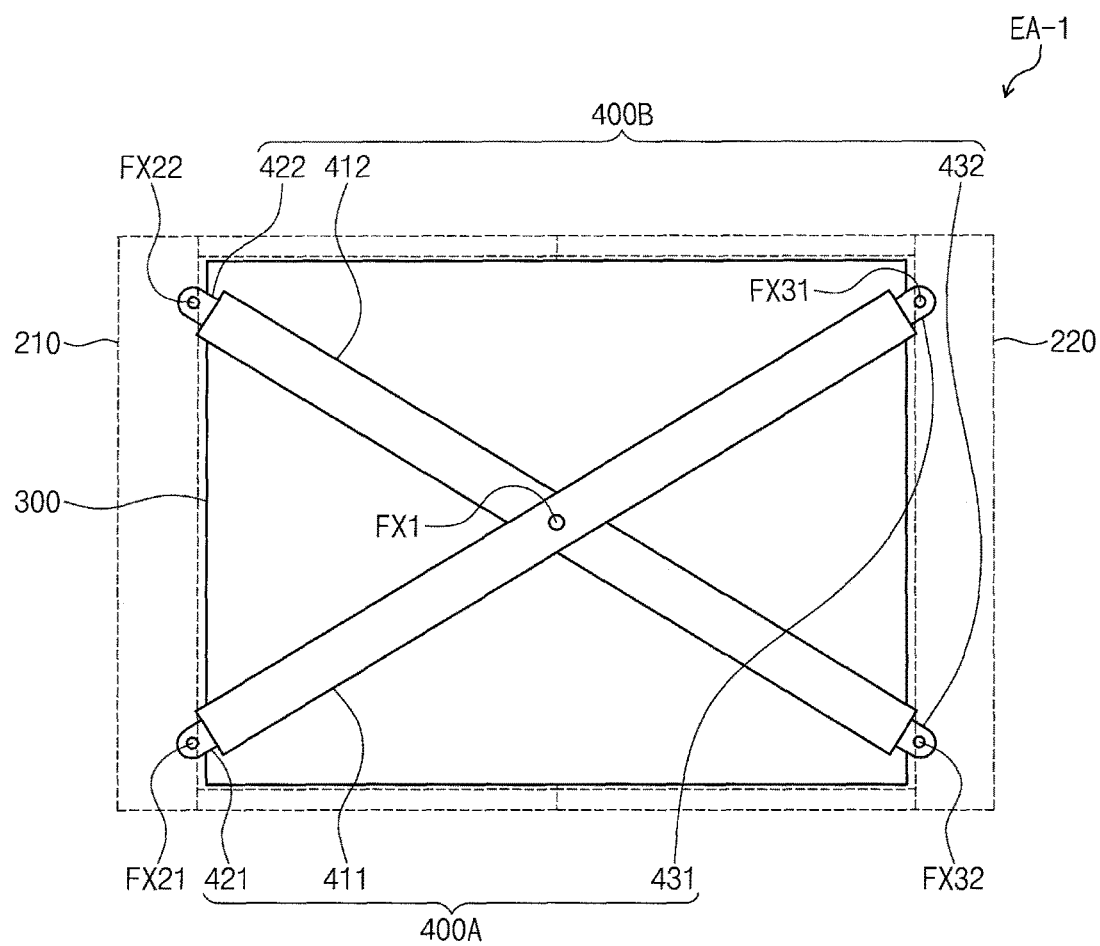
FIGS. 6A and 6B are plan views illustrating some components of an electronic device according to some embodiments of the inventive concept.
Figure 6B:
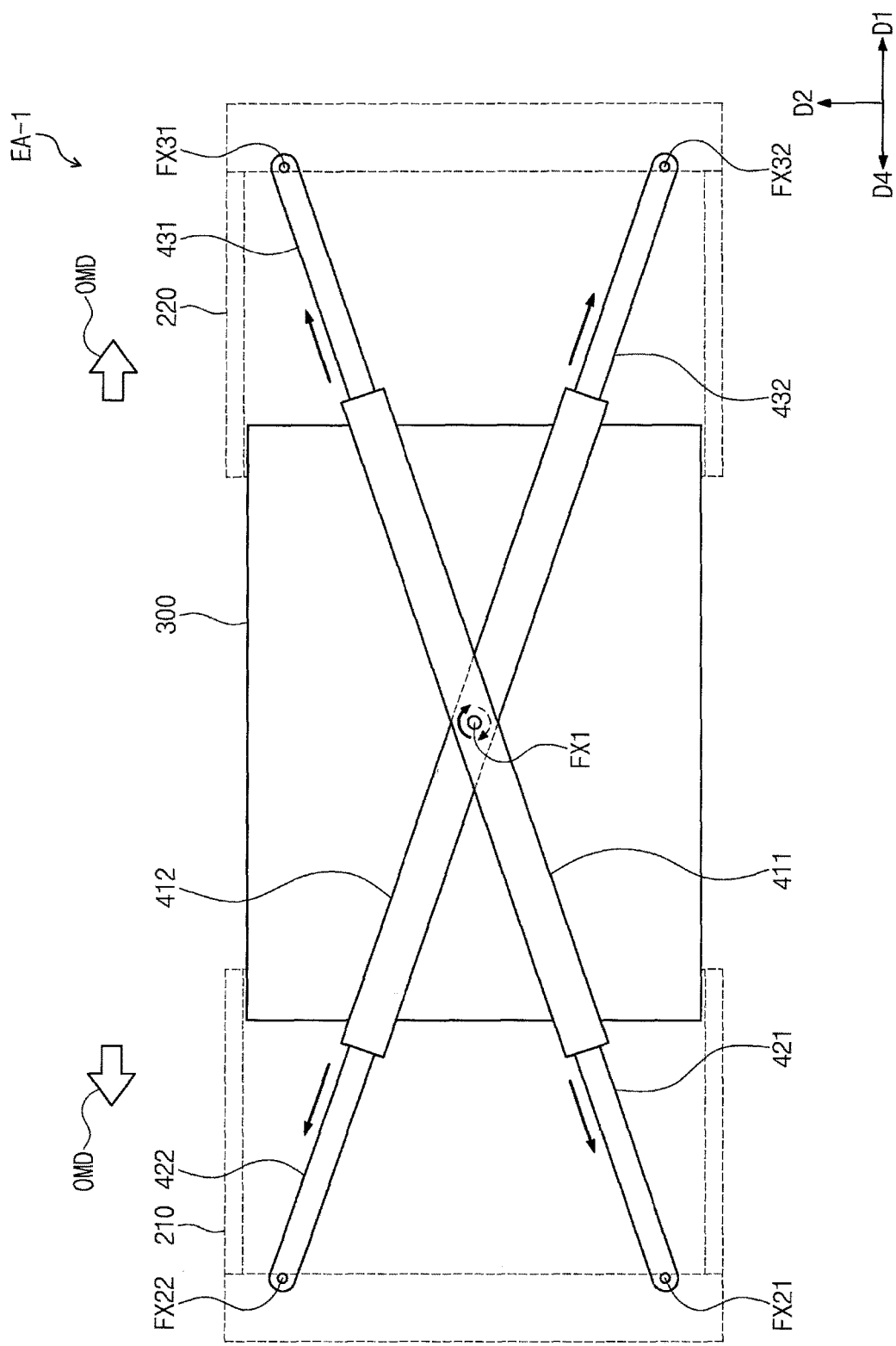

FIGS. 6A and 6B are plan views illustrating some components of an electronic device according to some embodiments of the inventive concept. FIG. 6A illustrates a plan view of an electronic device EA-1 in the first mode, and FIG. 6B illustrates a plan view of the electronic device EA-1 in the second mode.

For convenience in illustration, in FIGS. 6A and 6B, the fastening member 300 and the hinge unit are depicted by solid lines, and the first and second case members 210 and 220 are depicted by dotted lines.

Hereinafter, the electronic device EA-1 according to some embodiments of the inventive concept will be described with reference to FIGS. 6A and 6B. For concise description, an element previously described with reference to FIGS. 1A to 5B may be identified by a similar or identical reference number without repeating an overlapping description thereof.

As shown in FIGS. 6A and 6B, the electronic device EA-1 may include a plurality of hinge units. In the present embodiment, the plurality of hinge units may include a first hinge unit 400A and a second hinge unit 400B.

The first hinge unit 400A may include a body member 411, a first moving member 421, and a second moving member 431. The body member 411 may be coupled to a fastening member 300, and may be configured to perform a rotational motion on the fastening member 300.

The first and second moving members 421 and 431 may be configured to perform a linear motion in a length direction of the body member 411. The first and second moving members 421 and 431 may be coupled to the first and second case members 210 and 220, respectively, and each of the first and second moving members 421 and 431 may be extracted from, or inserted into, an internal space of the body member 411 in response to the linear motion OMD of each of the first and second case members 210 and 220.

The second hinge unit 400B may include substantially the same components as those in the first hinge unit 400A. For example, the second hinge unit 400B may include a body member 412, a first moving member 422, and a second moving member 432.

The body member 412 may be coupled to the fastening member 300, and may be configured to perform a rotational motion on the fastening member 300. The first and second moving members 422 and 432 may be configured to perform a linear motion in a length direction of the body member 412. The first and second moving members 422 and 432 may be coupled to the first and second case members 210 and 220, respectively, and each of the first and second moving members 422 and 432 may be extracted from, or inserted into, an internal space of the body member 412 in response to the linear motion OMD of each of the first and second case members 210 and 220.

The first and second hinge units 400A and 400B may be coupled to the fastening member 300 by one first coupling member FX1. Here, the first and second hinge units 400A and 400B may be coupled to the fastening member 300, while being provided to cross each other when viewed in a plan view.

Shapes of the first and second hinge units 400A and 400B may be changed in different directions when the operation mode is changed. For example, in the case where the operation mode is changed from the first mode to the second mode, the body member 411 of the first hinge unit 400A may rotate in the clockwise direction, whereas the body member 412 of the second hinge unit 400B may rotate in the counterclockwise direction.

Furthermore, in the case where the operation mode is changed from the first mode to the second mode, the first and second moving members 421 and 431 of the first hinge unit 400A may perform a linear motion in a diagonal direction that is inclined at an angle to both of the first and second directions D1 and D2, whereas the first and second moving members 422 and 432 of the second hinge unit 400B may perform a linear motion in a diagonal direction that is inclined at an angle to both of the fourth and second directions D4 and D2. Here, the fourth direction D4 may be opposite to the first direction D1.

Thus, a direction of the linear motion of the first and second moving members 421 and 431 of the first hinge unit 400A may be different from that of the first and second moving members 422 and 432 of the second hinge unit 400B. The first and second case members 210 and 220 may be coupled to, and supported by, both of the first and second hinge units 400A and 400B.

According to some embodiments of the inventive concept, because the electronic device EA-1 is configured to include a plurality of hinge units (e.g., the first and second hinge units 400A and 400B), it may be possible to improve stability in the linear motion of each of the first and second moving members 421 and 431. This may make it possible to improve reliability of the electronic device EA-1. Furthermore, the shape of the electronic device EA-1 may be changed in a relatively stable manner, and thus, it may be possible to increase the lifetime of the electronic device EA-1.

Figure 7A:
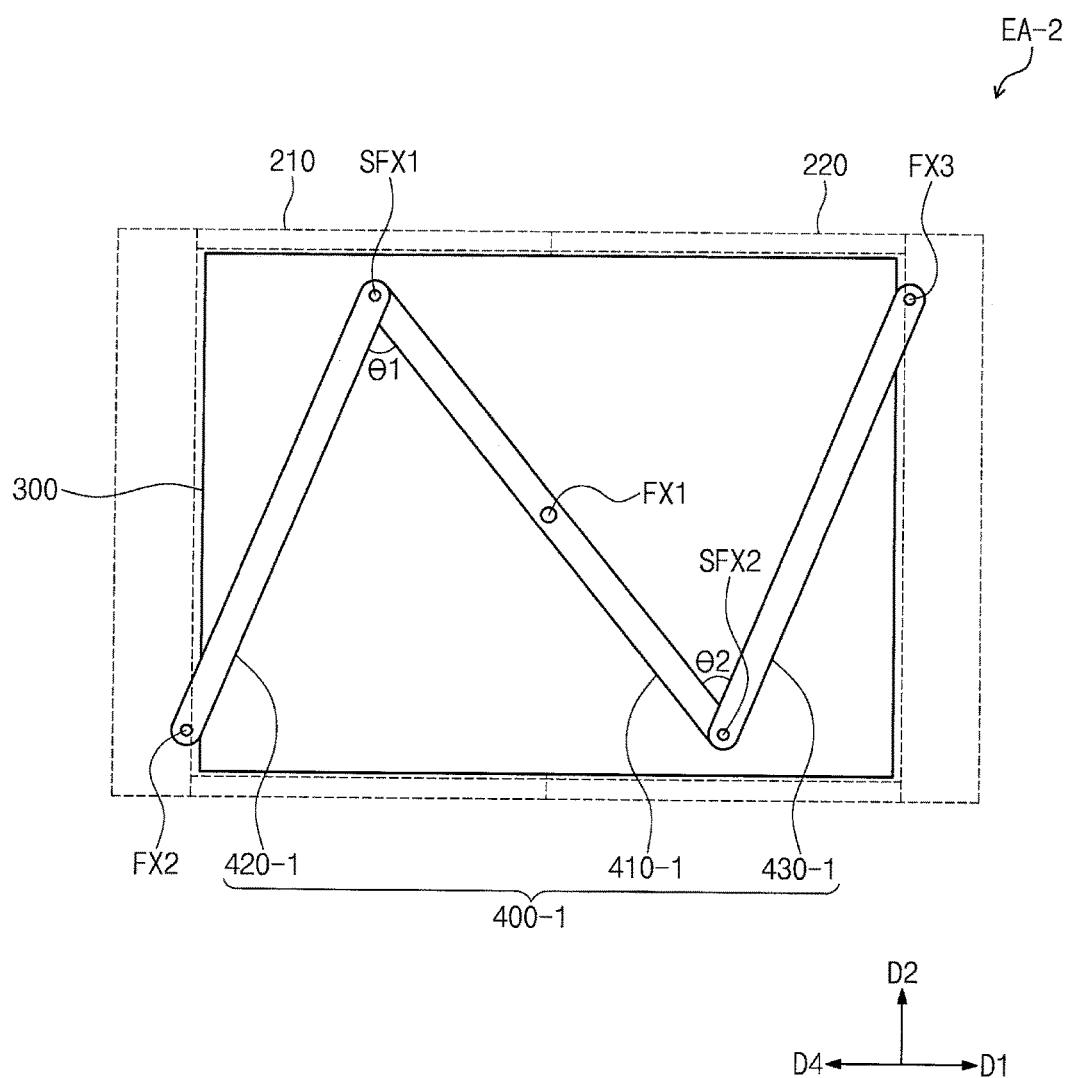

FIGS. 7A and 7B are plan views illustrating some components of an electronic device according to some embodiments of the inventive concept. FIG. 7A illustrates a plan view of an electronic device EA-2 in the first mode, and FIG. 7B illustrates a plan view of the electronic device EA-2 in the second mode.

For convenience in illustration, in FIGS. 7A and 7B, the fastening member 300 and a hinge unit 400-1 are depicted by solid lines, and the first and second case members 210 and 220 are depicted by dotted lines.

Hereinafter, the electronic device EA-2 according to some embodiments of the inventive concept will be described with reference to FIGS. 7A and 7B. For concise description, an element previously described with reference to FIGS. 1A to 6B may be identified by a similar or identical reference number without repeating an overlapping description thereof.

As shown in FIGS. 7A and 7B, an electronic device may include a hinge unit 400-1, in which a body member 410-1, a first moving member 420-1, and a second moving member 430-1 are provided.

The body member 410-1 may be coupled to the fastening member 300, and may be configured to perform a rotational motion on the fastening member 300. The body member 410-1 may be coupled to the fastening member 300 by the first coupling member FX1. The body member 410-1 may perform the rotational motion about a rotating axis passing through the first coupling member FX1.

The first moving member 420-1 may be a rod-shaped structure extending in a direction. An end of the first moving member 420-1 may be coupled to the first case member 210 by the second coupling member FX2.

The second moving member 430-1 may be a rod-shaped structure extending in a direction. An end of the second moving member 430-1 may be coupled to the second case member 220 by the third coupling member FX3.

Here, the first moving member 420-1 may be coupled to the body member 410-1 by a first sub-coupling member SFX1. The first sub-coupling member SFX1 may be used to couple an opposite end of the first moving member 420-1 (e.g., an end that is opposite to the end coupled to the first case member 210 by the second coupling member FX2) to an end of the body member 410-1.

The second moving member 430-1 may be coupled to the body member 410-1 by a second sub-coupling member SFX2. The second sub-coupling member SFX2 may be used to couple an opposite end of the second moving member 430-1 (e.g., an end that is opposite to the end coupled to the second case member 220 by the third coupling member FX3) to an opposite end of the body member 410-1.

When an operation mode of the electronic device EA-2 is changed, a position of each of the first and second sub-coupling members SFX1 and SFX2 may be changed when viewed in a plan view. For example, as shown in FIGS. 7A and 7B, when the operation mode of the electronic device EA-2 is changed from the second mode to the first mode, the first sub-coupling member SFX1 may move in the second direction D2, and the second sub-coupling member SFX2 may move in a direction that is opposite to the second direction D2.

Due to the change in positions of the first and second sub-coupling members SFX1 and SFX2, angles between the first moving member 420-1 and the body member 410-1, and between the second moving member 430-1 and the body member 410-1, may be changed.

For example, an angle between the first moving member 420-1 and the body member 410-1, which are coupled to each other by the first sub-coupling member SFX1, may be a first angle 81 in the first mode, and may be a first changed angle 81-C in the second mode. The first changed angle θ1-C may be greater than the first angle 81. The first changed angle θ1-C may be variously adjusted in consideration of a planar area and a moving distance of the first case member 210. The first changed angle 81-C may be smaller than or equal to 180°.

Similarly, an angle between the second moving member 430-1 and the body member 410-1, which are coupled to each other by the second sub-coupling member SFX2, may be a second angle 82 in the first mode and a second changed angle 82-C in the second mode. The second changed angle 82-C may be greater than the second angle θ2. The second changed angle θ2-C may be variously adjusted in consideration of a planar area and a moving distance of the second case member 220. The second changed angle θ2-C may be smaller than or equal to 180°.

The angle between the first moving member 420-1 and the body member 410-1 may be changed to allow the hinge unit 400-1 to respond to the mode-dependent linear motion OMD of the first case member 210. Also, the angle between the second moving member 430-1 and the body member 410-1 may be changed to allow the hinge unit 400-1 to respond to the mode-dependent linear motion OMD of the second case member 220.

According to some embodiments of the inventive concept, because the electronic device EA-2 is configured to include the hinge unit 400-1, it may be possible to easily respond to a change in area of the electronic device EA-2, which is caused by the motions of the first and second case members 210 and 220. By variously designing the lengths of the body member 410-1, the first moving member 420-1, and the second moving member 430-1 in the hinge unit 400-1, it may be possible to respond to a change in area of the electronic device EA-2 when the operation mode of the electronic device EA-2 is changed from the first mode to the second mode or vice versa.

Figure 8A:
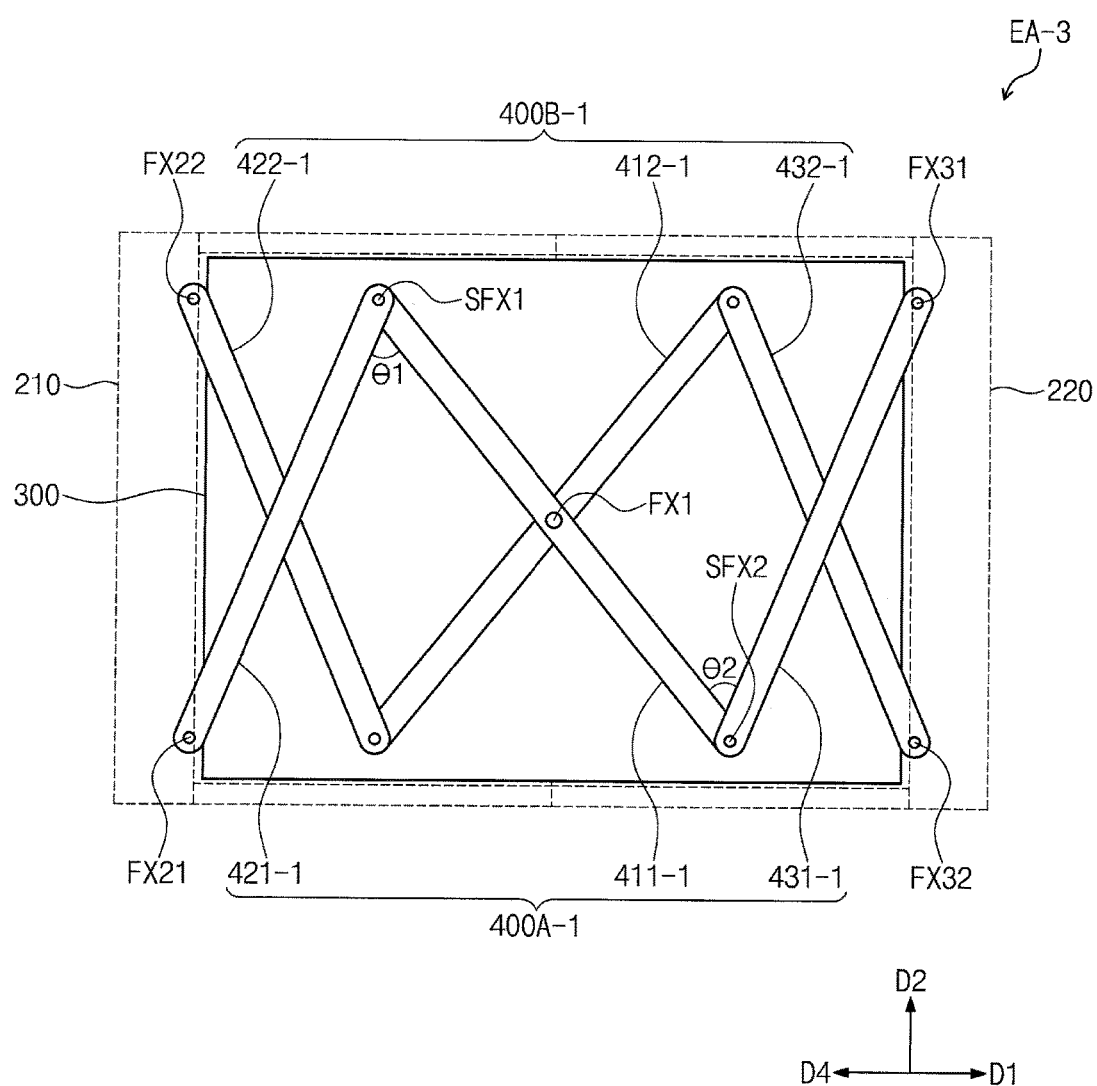
FIGS. 8A and 8B are plan views illustrating some components of an electronic device according to some embodiments of the inventive concept.
Figure 8B:
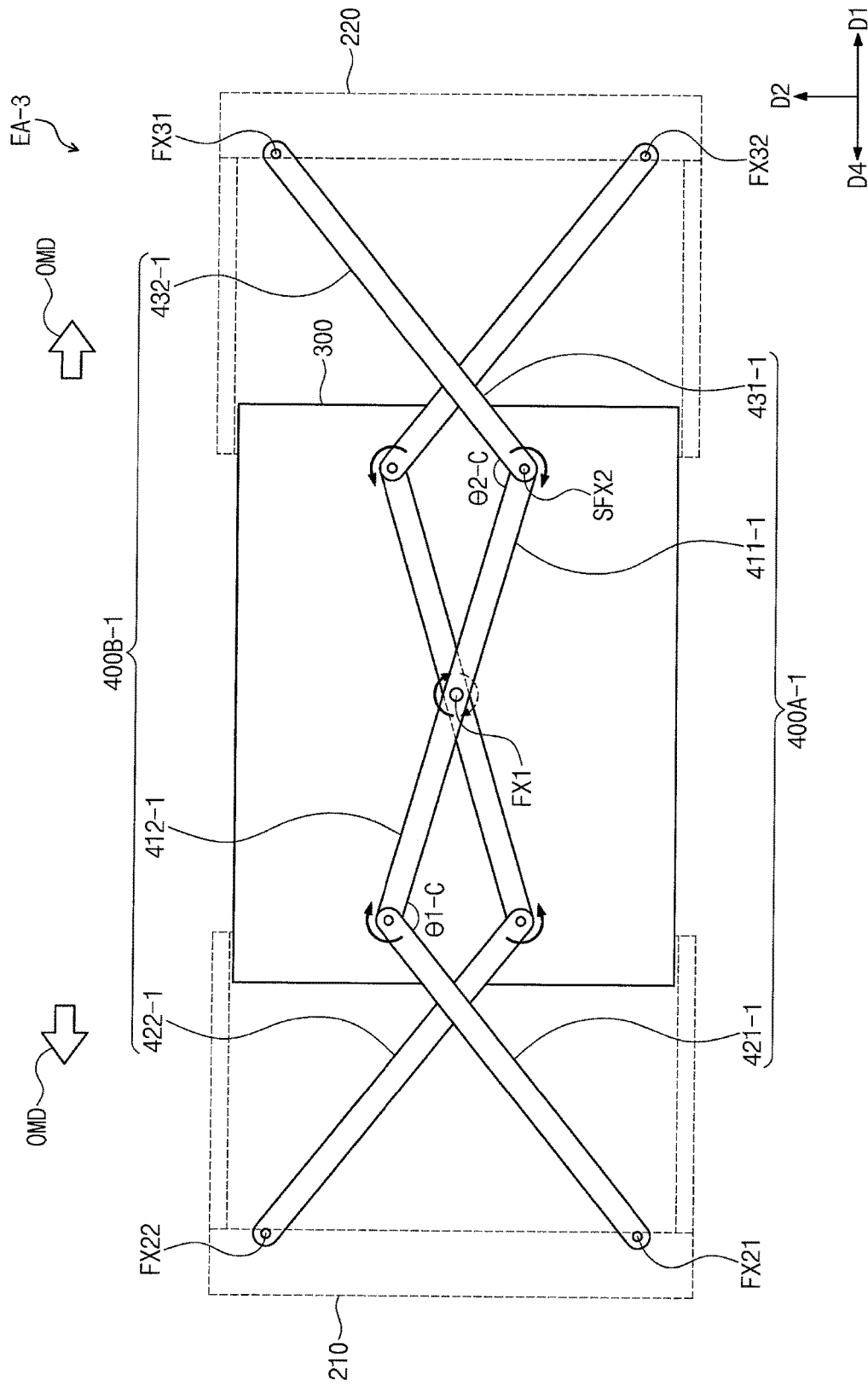

FIGS. 8A and 8B are plan views illustrating some components of an electronic device according to some embodiments of the inventive concept. FIG. 8A illustrates a plan view of an electronic device EA-3 in the first mode, and FIG. 8B illustrates a plan view of the electronic device EA-3 in the second mode.

For convenience in illustration, in FIGS. 8A and 8B, the fastening member 300 and the hinge unit 400-1 are depicted by solid lines, and the first and second case members 210 and 220 are depicted by dotted lines.

Hereinafter, the electronic device EA-2 according to some embodiments of the inventive concept will be described with reference to FIGS. 8A and 8B. For concise description, an element previously described with reference to FIGS. 1A to 7B may be identified by a similar or identical reference number without repeating an overlapping description thereof.

As shown in FIGS. 8A and 8B, an electronic device may include a plurality of hinge units. The hinge units may include a first hinge unit 400A-1 and a second hinge unit 400B-1.

Each of the first and second hinge units 400A-1 and 400B-1 may be configured to have a structure corresponding to that of the hinge unit 400-1 shown in FIG. 7A. For example, the first hinge unit 400A-1 may include a body member 411-1, a first moving member 421-1, and a second moving member 431-1, and the second hinge unit 400B-1 may include a body member 412-1, a first moving member 422-1, and a second moving member 432-1.

The first and second hinge units 400A-1 and 400B-1 may be provided to cross each other. The first and second hinge units 400A-1 and 400B-1 may have different motion directions.

For example, the body member 411-1 of the first hinge unit 400A-1 may be arranged to be parallel to a diagonal direction crossing the first and second directions D1 and D2. Thus, the body member 411-1 of the first hinge unit 400A-1 may perform a rotational motion in a counterclockwise direction, when the operation mode is changed from the first mode to the second mode.

Alternatively, the body member 412-1 of the second hinge unit 400B-1 may be provided to cross the body member 411-1 of the first hinge unit 400A-1. In other words, the body member 412-1 of the second hinge unit 400B-1 may be arranged to be parallel to a diagonal direction crossing the fourth and second directions D4 and D2. Thus, the body member 412-1 of the second hinge unit 400B-1 may perform a rotational motion in a clockwise direction, when the operation mode is changed from the first mode to the second mode.

When the operation mode is changed from the first mode to the second mode, each of the first and second moving members 421-1 and 431-1 of the first hinge unit 400A-1 may perform a rotational motion about a corresponding sub-coupling member SFX1 or SFX2, and such a rotational motion may be performed to increase an angle relative to the body member 411-1. Similarly, when the operation mode is changed from the first mode to the second mode, each of the first and second moving members 422-1 and 432-1 of the second hinge unit 400B-1 may perform a rotational motion about a corresponding sub-coupling member, and such a rotational motion may be performed to increase an angle relative to the body member 412-1.

Here, because the first and second moving members 421-1 and 431-1 of the first hinge unit 400A-1 are respectively arranged to cross the first and second moving members 422-1 and 432-1 of the second hinge unit 400B-1, the first hinge unit 400A-1 and the second hinge unit 400B-1 may be moved in a direction reducing a distance between the sub-coupling members thereof when the operation mode is changed from the first mode to the second mode. For example, the sub-coupling members SFX2 and SFX1 of the first hinge unit 400A-1 may be respectively moved in the second direction D2 and in a direction that is opposite to the second direction D2, whereas the sub-coupling members of the second hinge unit 400B-1 may be correspondingly moved.

The shape of the first hinge unit 400A-1 may be symmetrically changed with respect to that of the second hinge unit 400B-1. According to some embodiments of the inventive concept, because the electronic device EA-3 includes a plurality of hinge units, the electronic device EA-3 can stably respond to changes in shape or position of the first and second case members 210 and 220 and can have improved reliability.

Figure 9A:
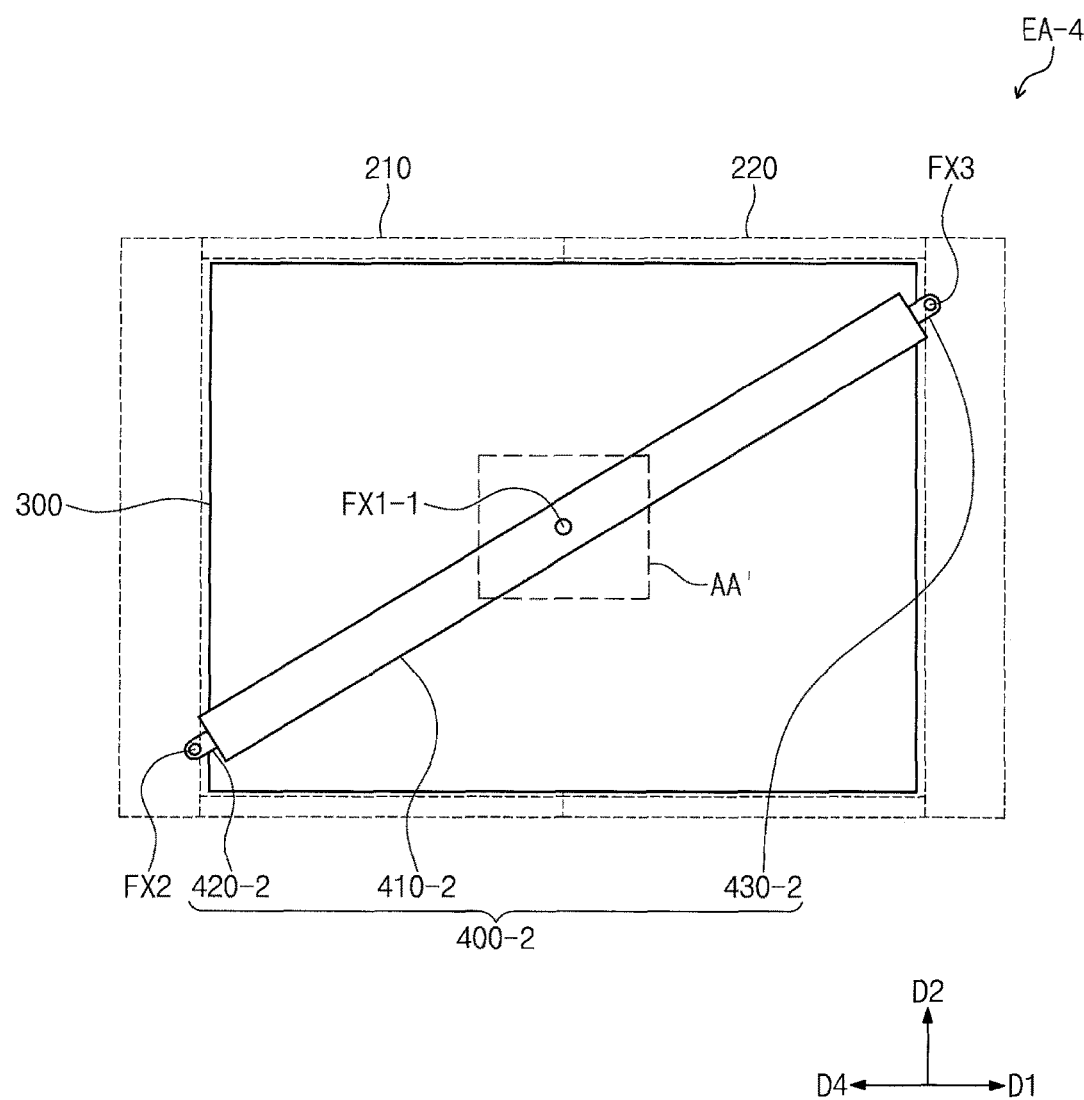
FIGS. 9A and 9B are plan views illustrating some components of an electronic device according to some embodiments of the inventive concept.
Figure 9B:
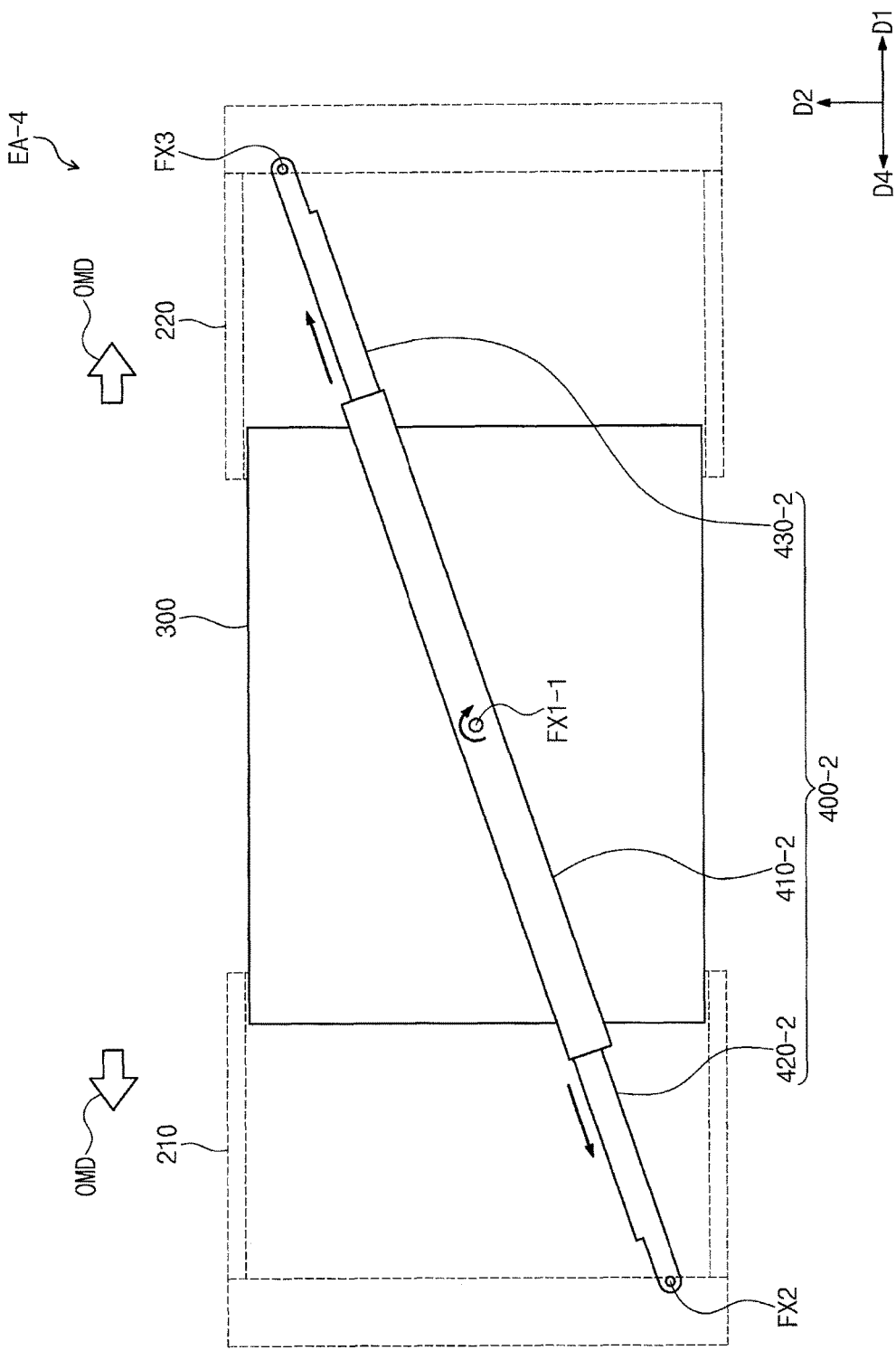

FIGS. 9A and 9B are plan views illustrating some components of an electronic device according to some embodiments of the inventive concept. FIG. 9A illustrates a plan view of an electronic device EA-4 in the first mode, and FIG. 9B illustrates a plan view of the electronic device EA-4 in the second mode.

For convenience in illustration, in FIGS. 9A and 9B, the fastening member 300 and the hinge unit 400-1 are depicted by solid lines, and the first and second case members 210 and 220 are depicted by dotted lines.

Hereinafter, an electronic device according to some embodiments of the inventive concept will be described with reference to FIGS. 9A and 9B. For concise description, an element previously described with reference to FIGS. 1A to 8B may be identified by a similar or identical reference number without repeating an overlapping description thereof.

As shown in FIGS. 9A and 9B, the electronic device EA-4 may include a hinge unit 400-2, which is coupled to the fastening member 300 by a first coupling member FX1-1 and includes a body member 410-2, a first moving member 420-2, and a third moving member 430-2.

The hinge unit 400-2 may be configured to exhibit substantially the same behavior as that of the hinge unit 400 of FIG. 2. For example, when viewed in a plan view, the body member 410-2 may be configured to perform a rotational motion about the first coupling member FX1-1, and the first moving member 420-2 and the second moving member 430-2 may be configured to perform a linear motion parallel to a length direction of the body member 410-2.

Figure 9C:
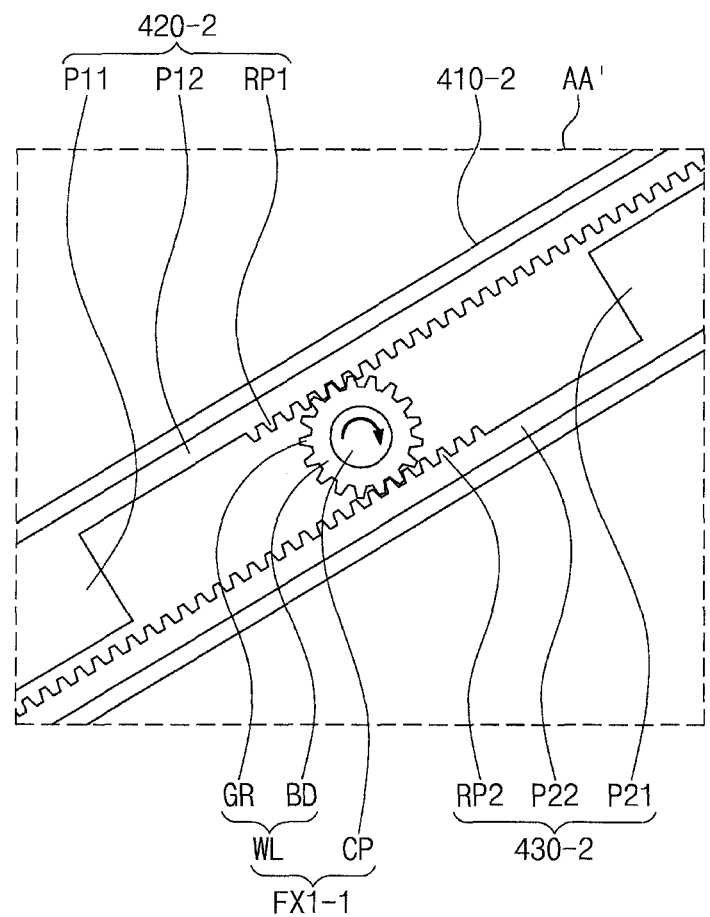
FIG. 9C depicts the area AA' shown in FIG. 9A.

Referring to FIG. 9C, the first moving member 420-2 and the second moving member 430-2 may be contained in an internal space of a body member 410-2. Each of the first and second moving members 420-2 and 430-2 may include a plurality of portions. For example, the first moving member 420-2 may include a first portion P11, a second portion P12, and a protruding portion RP1.

The second moving member 430-2 may have a shape corresponding to that of the first moving member 420-2. For example, the second moving member 430-2 may include a first portion P21, a second portion P22, and a protruding portion RP2.

In the present embodiment, each of the first portions P11 and P21 may be thicker than each of the second portions P12 and P22. A difference in thickness between the second portions P12 and P22 and the first portions P11 and P21 may correspond to a size of the first coupling member FX1-1.

The protruding portions RP1 and RP2 may be defined on top surfaces of the second portions P12 and P22. Each of the protruding portions RP1 and RP2 may have a shape that is fittingly engaged with the first coupling member FX1-1 to be described below.

The first coupling member FX1-1 may include a center portion CP and a wheel portion WL. The center portion CP may be provided to penetrate the body member 410-2 and may be coupled to the fastening member 300. The center portion CP may couple the hinge unit 400-2 to the fastening member 300 in such a way that the hinge unit 400-2 can be rotated on the fastening member 300. In the present embodiment, the center portion CP may be used as a rotating axis for the rotational motion of the body member 410-2.

The wheel portion WL may include a body member portion BD and a gear portion GR. The body member portion BD may have a shape surrounding the center portion CP, when viewed in a plan view. The gear portion GR may be provided along an outer rim of the body member portion BD. In the present embodiment, the gear portion GR may be connected to the body member portion BD to form a single body member with the body member portion BD. However, the inventive concept is not limited to the above examples, and the gear portion GR and the body member portion BD may be individual components that are separated from each other and are separately assembled in the body member portion BD.

The gear portion GR may have a saw tooth shape. The gear portion GR may be fittingly engaged with the protruding portions RP1 and RP2 of the first and second moving members 420-2 and 430-2.

According to some embodiments of the inventive concept, because the electronic device EA-4 includes the first coupling member FX1-1 with the gear portion GR and the hinge unit 400-2 with the protruding portions RP1 and RP2, it may be possible to realize a discontinuous motion of the hinge unit 400-2. In detail, the gear portion GR, the protruding portion RP1 of the first moving member 420-2, and the protruding portion RP2 of the second moving member 430-2 may be configured to allow the rotational motion of the body member 410-2 and the linear motions of the first and second moving members 420-2 and 430-2 to be performed in a discontinuous/stepwise manner.

Figure 10:
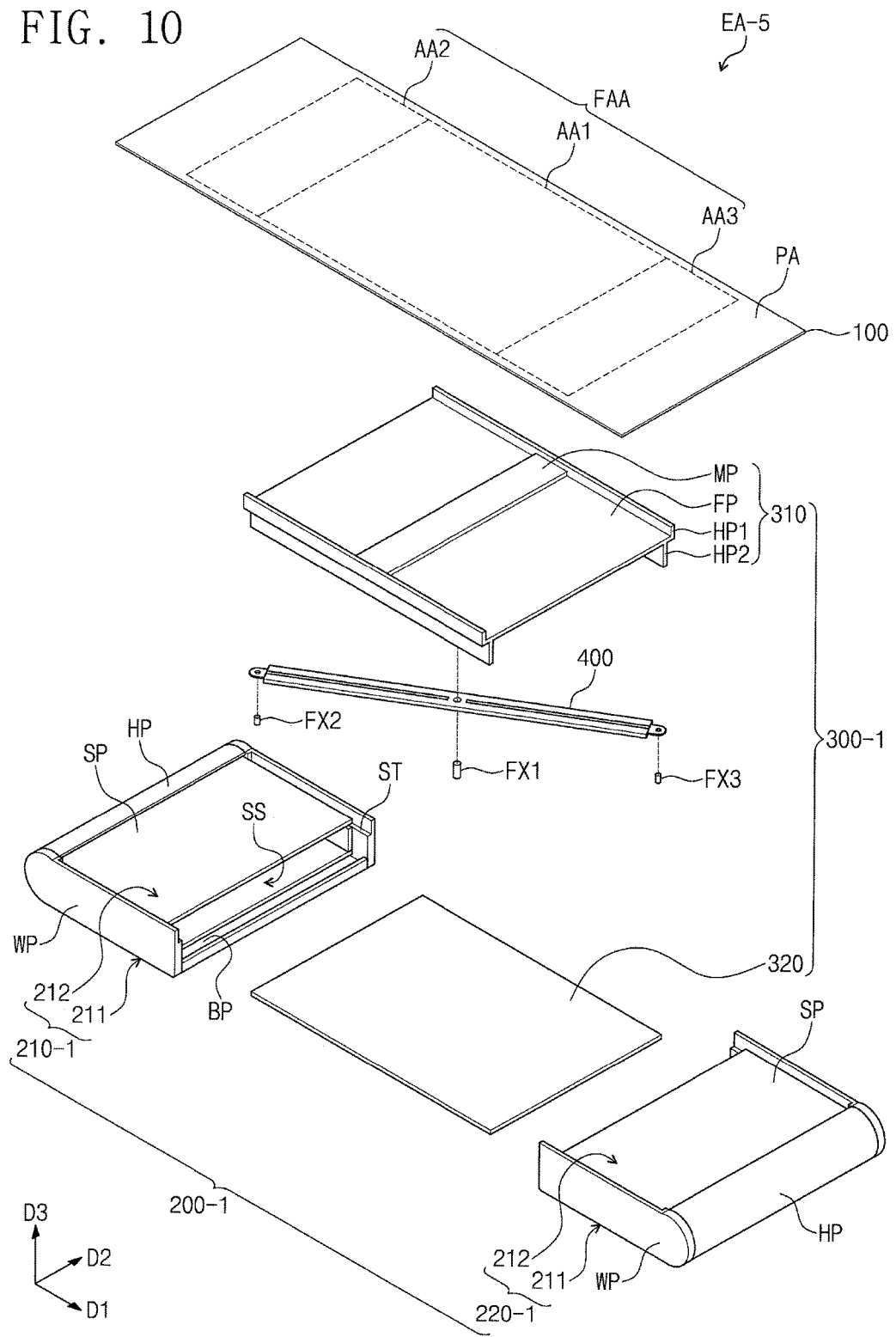
FIG. 10 is an exploded perspective view of an electronic device according to some embodiments of the inventive concept.
Figure 11A:
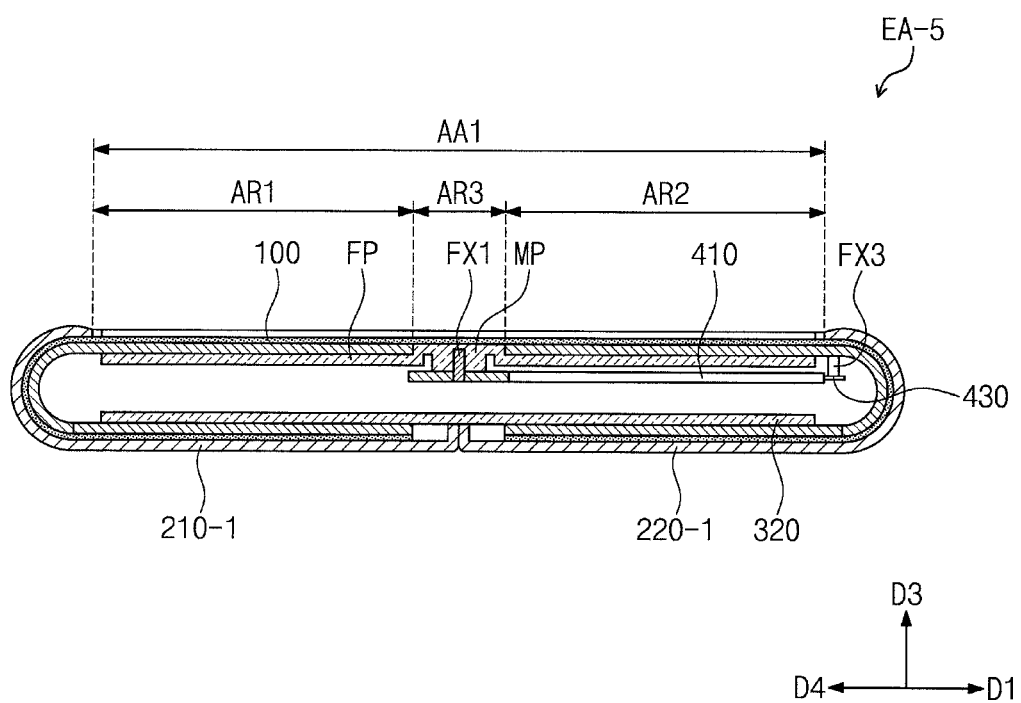
FIGS. 11A and 11B are sectional views of the electronic device, in which components of FIG. 10 are assembled.
Figure 11B:
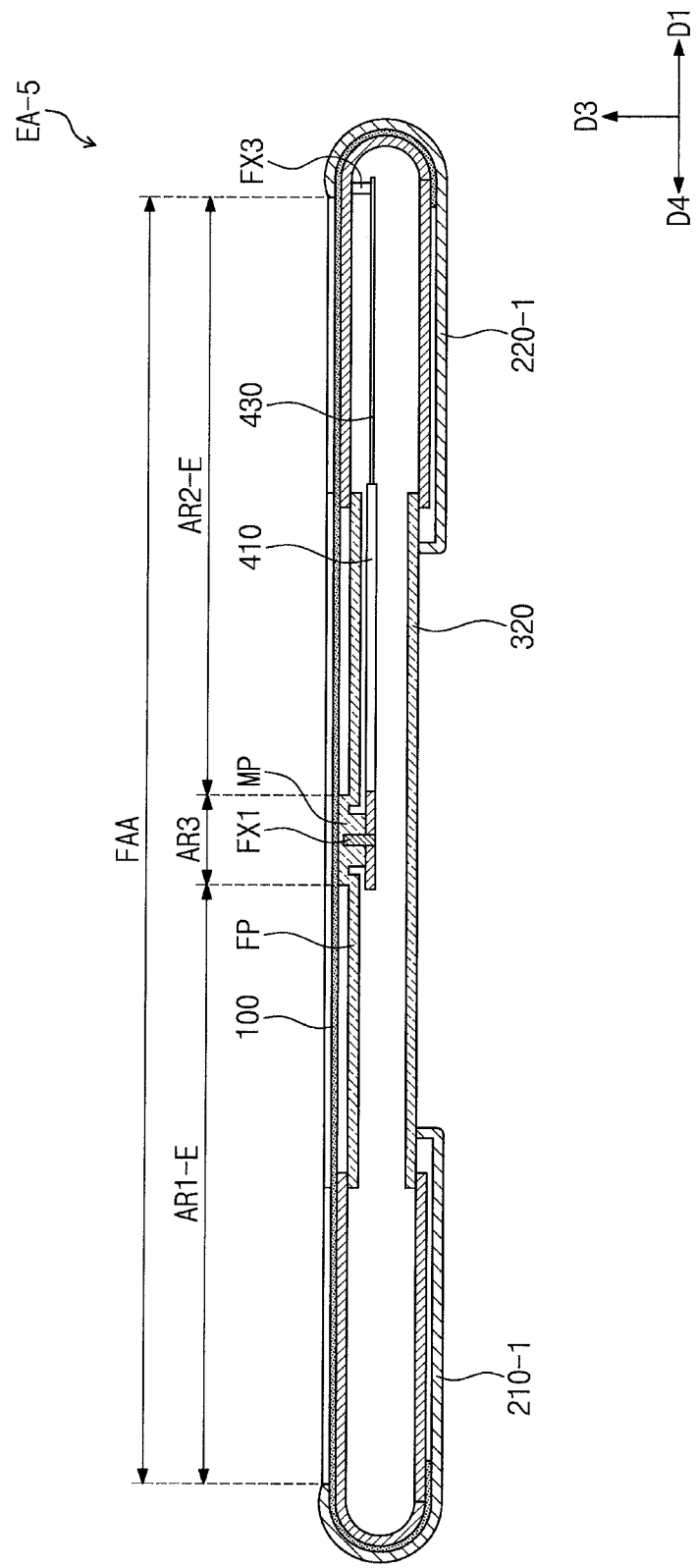

Thus, the linear motions OMD of the first and second case members 210 and 220 may be performed in a discontinuous manner. According to some embodiments of the inventive concept, it may be possible to easily control the linear motions OMD of the first and second case members 210 and 220 in a stepwise manner and to stably maintain a suitable state determined through a suitable linear motion OMD. Accordingly, according to some embodiments of the inventive concept, it may be possible to realize the electronic device EA-4, whose mechanical behaviors for a mode-dependent change in shape can be easily controlled FIG. 10 is an exploded perspective view of an electronic device according to some embodiments of the inventive concept. FIGS. 11A and 11B are sectional views of the electronic device, in which components of FIG. 10 are assembled. For convenience in illustration, FIG. 11A illustrates a sectional view of an electronic device EA-5 in the first mode, and FIG. 11B illustrates a sectional view of the electronic device EA-5 in the second mode.

Hereinafter, the electronic device EA-5 according to some embodiments of the inventive concept will be described with reference to FIGS. 10, 11A, and 11B. For concise description, an element previously described with reference to FIGS. 1A to 9C may be identified by a similar or identical reference number without repeating an overlapping description thereof.

As shown in FIG. 10, the electronic device EA-5 may include an electronic panel 100, a housing unit 200-1, a fastening member 300-1, and a hinge unit 400. Except for differences regarding the housing unit 200-1 and the fastening member 300-1, the electronic device EA-5 may be configured to have substantially the same features as the electronic device EA of FIG. 2. Thus, detailed description of the electronic panel 100 and the hinge unit 400 will be omitted.

The housing unit 200-1 may include a first case member 210-1 and a second case member 220-1. The first case member 210-1 may include a first case 211 and a second case 212, and the second case member 220-1 may include a first case 211 and a second case 212.

The first case member 210-1 may be configured to contain a portion of the fastening member 300-1. Except for the supporting portion SP of FIG. 2, the first case 211 of the first case member 210-1 may be configured to have substantially the same structure as that of the first case member 210 shown in FIG. 2.

In detail, the first case 211 may include the wall portion WP, the handle portion HP, and the bottom portion BP. The wall portion WP may be connected to two opposite sides of the bottom portion BP, and the handle portion HP may be connected to the wall portion WP and the bottom portion BP. The wall portion WP, the handle portion HP, and the bottom portion BP may be connected to each other to define a space.

In some embodiments, the wall portion WP may include a stepwise portion ST. The stepwise portion ST may be defined in, or by an inner portion of, the wall portion WP. The stepwise portion ST may be configured to allow for mechanical engagement with the fastening member 300-1, as described below, and to support a portion of the fastening member 300-1.

The second case 212 of the first case member 210-1 may be contained in a space defined by the wall portion WP, the handle portion HP, and the bottom portion BP. The second case 212 of the first case member 210-1 may have a hexahedral shape with one side opened. A portion of the fastening member 300-1 to be described below may be inserted into the opened side SS of the second case 212.

The second case 212 of the first case member 210-1 may be configured to support a portion of the electronic panel 100. An upper portion of the second case 212 of the first case member 210-1 may be used as a component corresponding to the supporting portion SP shown in FIG. 2. For example, the second case 212 of the first case member 210-1 may be used to support a portion of the first region AA1 of the electronic panel 100 in the first mode and to support the second region AA2 of the electronic panel 100 in the second mode.

The second case member 220-1 may be configured to contain another portion of the fastening member 300-1. The first and second case members 210-1 and 220-1 may be arranged to be symmetric to each other.

The first case 211 of the second case member 220-1 may correspond to the first case 211 of the first case member 210-1, and the second case 212 of the second case member 220-1 may correspond to the second case 212 of the first case member 210-1. For brevity's sake, a detailed description of the second case member 220-1 will be omitted.

The fastening member 300-1 may include a first fastening member 310 and a second fastening member 320. The first fastening member 310 and the second fastening member 320 may be arranged to be spaced apart from each other with the hinge unit 400 interposed therebetween.

The first fastening member 310 may include a middle portion MP, a flat portion FP, a first sidewall portion HP1, and a second sidewall portion HP2. The middle portion MP and the flat portion FP may define an upper side portion of the first fastening member 310, and the first sidewall portion HP1 and the second sidewall portion HP2 may define a side portion of the first fastening member 310.

The middle portion MP may be placed near a center of the first fastening member 310 in the first direction D1. The middle portion MP may protrude upwardly in the third direction D3 relative to the flat portion FP.

The middle portion MP may support a middle portion of the electronic panel 100. Furthermore, the middle portion MP may be a portion to which the first coupling member FX1 is assembled. Accordingly, the middle portion MP may include a hole that is defined to contain the first coupling member FX1.

When viewed in a sectional view defined by the second direction D2 and a third direction D3, the first and second sidewall portions HP1 and HP2 may be misaligned to each other, and the flat portion FP may be placed therebetween. The misalignment between the first and second sidewall portions HP1 and HP2 may define a height difference at a side of the first fastening member 310.

The height difference defined by the first and second sidewall portions HP1 and HP2 may correspond to the stepwise portion ST defined in the housing unit 200-1. The height difference defined by the first and second sidewall portions HP1 and HP2 may allow the first fastening member 310 to be fittingly and stably engaged with the stepwise portion ST of the housing unit 200-1. That is, the presence of the stepwise portion ST may allow the housing unit 200-1 to stably perform the linear motion relative to the first fastening member 310.

The second fastening member 320 may be contained in the housing unit 200-1. In detail, a portion of the second fastening member 320 may be contained in a space defined by the second case 212 of the first case member 210-1, and an opposite portion of the second fastening member 320 may be contained in a space defined by the second case 212 of the second case member 220-1.

In the first mode, the second fastening member 320 may be veiled by the housing unit 200-1, and in the second mode, a portion of the second fastening member 320 may be exposed from the housing unit 200-1 and may be used as an exterior of the electronic device EA-5. Furthermore, in the second mode, the second fastening member 320 may be used to stably protect the hinge unit 400 from the outside.

The second fastening member 320 may have a shape corresponding to the fastening member 300 shown in FIG. 2. However, the inventive concept is not limited to the above examples, and the shape of the second fastening member 320 may be variously changed.

As shown in FIG. 11A, the electronic device EA-5 may be configured to allow the first active region AA1 to be exposed to the outside in the first mode. Except for the first active region AA1, all regions of the electronic panel 100 (e.g., the second and third active regions AA2 and AA3) may be contained in the housing unit 200-1, and not be exposed to the outside, in the first mode.

In the present embodiment, the first active region AA1 provided in the first mode may include a first region AR1 and a second region AR2, which are overlapped with the flat portion FP, and a third region AR3, which overlaps the middle portion MP. Accordingly, a width of the first active region AA1 measured in the first direction D1 may correspond to a sum of widths of two flat portions FP and the middle portion MP measured in the first direction D1.

When viewed in a plan view, because the hinge unit 400 is arranged in a direction that is diagonal to the first and second directions D1 and D2, only a portion of the hinge unit 400 overlapping the second and third regions AR2 and AR3 is illustrated in vertical sections shown in FIGS. 11A and 11B. As shown in FIG. 11A, the first coupling member FX1 may be provided to penetrate the body member 410, and the body member 410 may be coupled to the middle portion MP by the first coupling member FX1. The third coupling member FX3 may be provided to couple the second moving member 430 to the second case 212 of the second case member 220-1.

As shown in FIG. 11B, in the case where the operation mode of the electronic device EA-5 is changed to the second mode, an exposed active region may be expanded to form the second active region FAA. The second active region FAA may include an expanded first region AR1-E, an expanded second region AR2-E, and the third region AR3. The expanded first region AR1-E and the expanded second region AR2-E may be regions that are respectively expanded from the first and second regions AR1 and AR2 of FIG. 11A by the motions of the first and second case members 210-1 and 220-1.

Here, when compared with the second moving member 430 of FIG. 11A, the second moving member 430 is illustrated to have a relatively increased length, or to be more exposed. When there is a change in operation mode of the electronic device EA-5, the second moving member 430 may be inserted into, or extracted from, the body member 410 through its linear motion, as described above.

The length of the hinge unit 400 in the first direction D1 and in a direction diagonal to the first direction D1 may be changed through the linear motion of the second moving member 430. This may allow the hinge unit 400 to stably respond to the linear motions of the first and second case members 210-1 and 220 in the first direction D1.

Figure 12A:
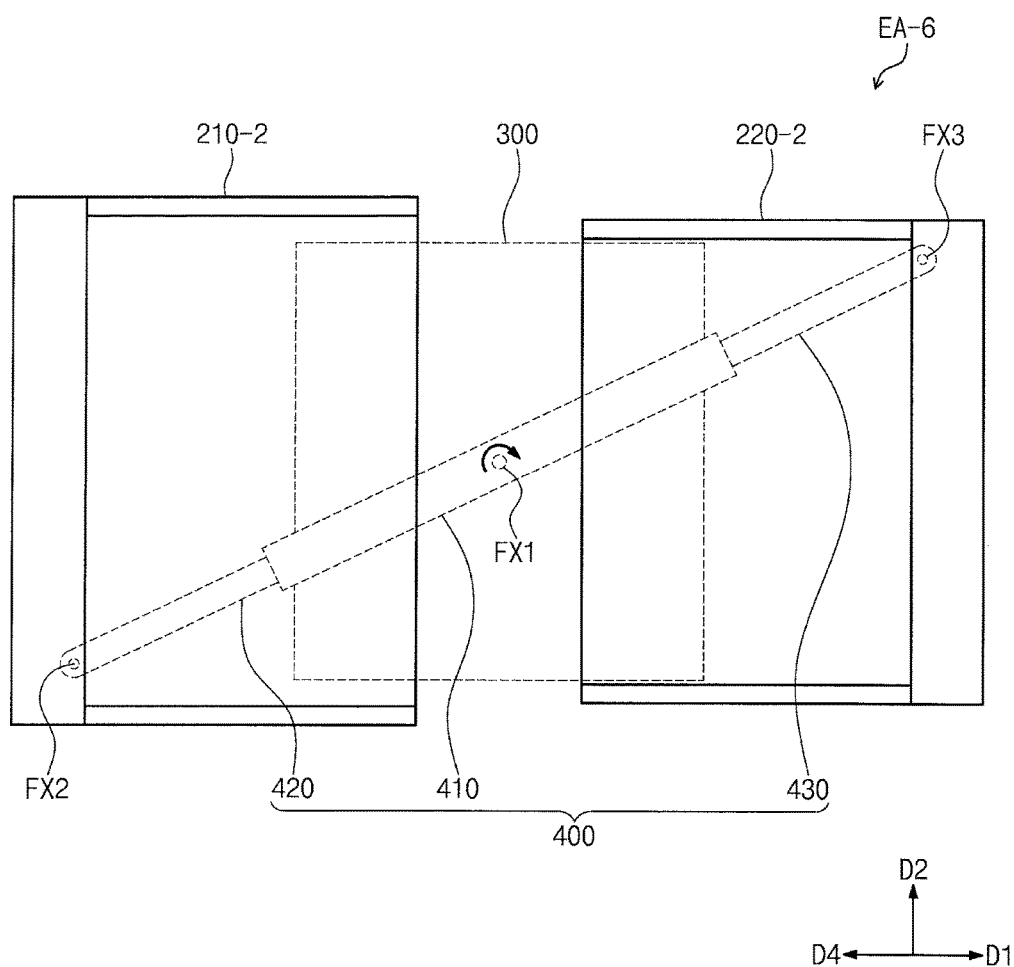
FIGS. 12A and 12B are plan views of an electronic device according to some embodiments of the inventive concept.
Figure 12B:
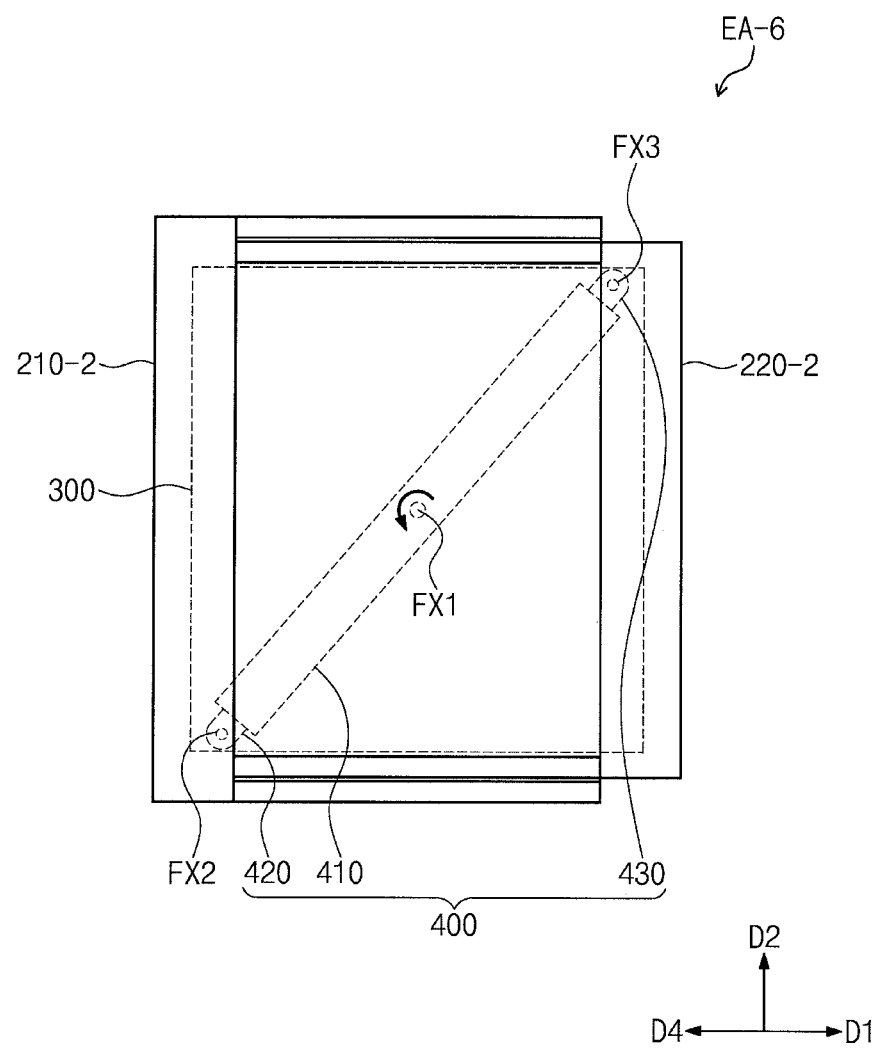

FIGS. 12A and 12B are plan views of an electronic device according to some embodiments of the inventive concept. FIG. 12A illustrates a plan view of an electronic device EA-6 in the second mode, and FIG. 12B illustrate a plan view of the electronic device EA-6 in the first mode.

For convenience in illustration, in each of FIGS. 12A and 12B, only some components of the electronic device EA-6 are illustrated, with some of the illustrated components being depicted by dotted lines. Hereinafter, an electronic device according to some embodiments of the inventive concept will be described with reference to FIGS. 12A and 12B.

As shown in FIGS. 12A and 12B, the electronic device EA-6 may include the first case member 210-2 and the second case member 220-2. In FIGS. 12A and 12B, the fastening member 300 and the hinge unit 400 are depicted by dotted lines. The fastening member 300 and the hinge unit 400 may correspond to the fastening member 300 and the hinge unit 400 shown in FIG. 2. Thus, detailed description thereof will be omitted.

In the present embodiment, the first case member 210-2 and the second case member 220-2 may have different shapes from each other. Furthermore, a planar area of the first case member 210-2 may be greater than that of the second case member 220-2.

As shown in FIG. 12A, in the second mode, the first case member 210-2 and the second case member 220-2 may be spaced apart from each other in the first direction D1. This may allow the electronic device EA-6 to provide an enlarged active region to a user.

As shown in FIG. 12B, in the first mode, the hinge unit 400 may perform a rotational motion in a counterclockwise direction, and the first and second case members 210-2 and 220-2 may move in the first and fourth directions D1 and D4, respectively. In this case, each of the first and second case members 210-2 and 220-2 may be arranged to overlap the fastening member 300.

At this time, the first and second case members 210-2 and 220-2 may be arranged to overlap each other. For example, the second case member 220-2 may be contained in the first case member 210-2.

According to some embodiments of the inventive concept, in the first mode, the electronic device EA-6 may have a comparatively reduced or minimized size (e.g., ⅓ times that in the second mode). Thus, the electronic device EA-6 can have improved portability and improved expandability.

Figure 13A:
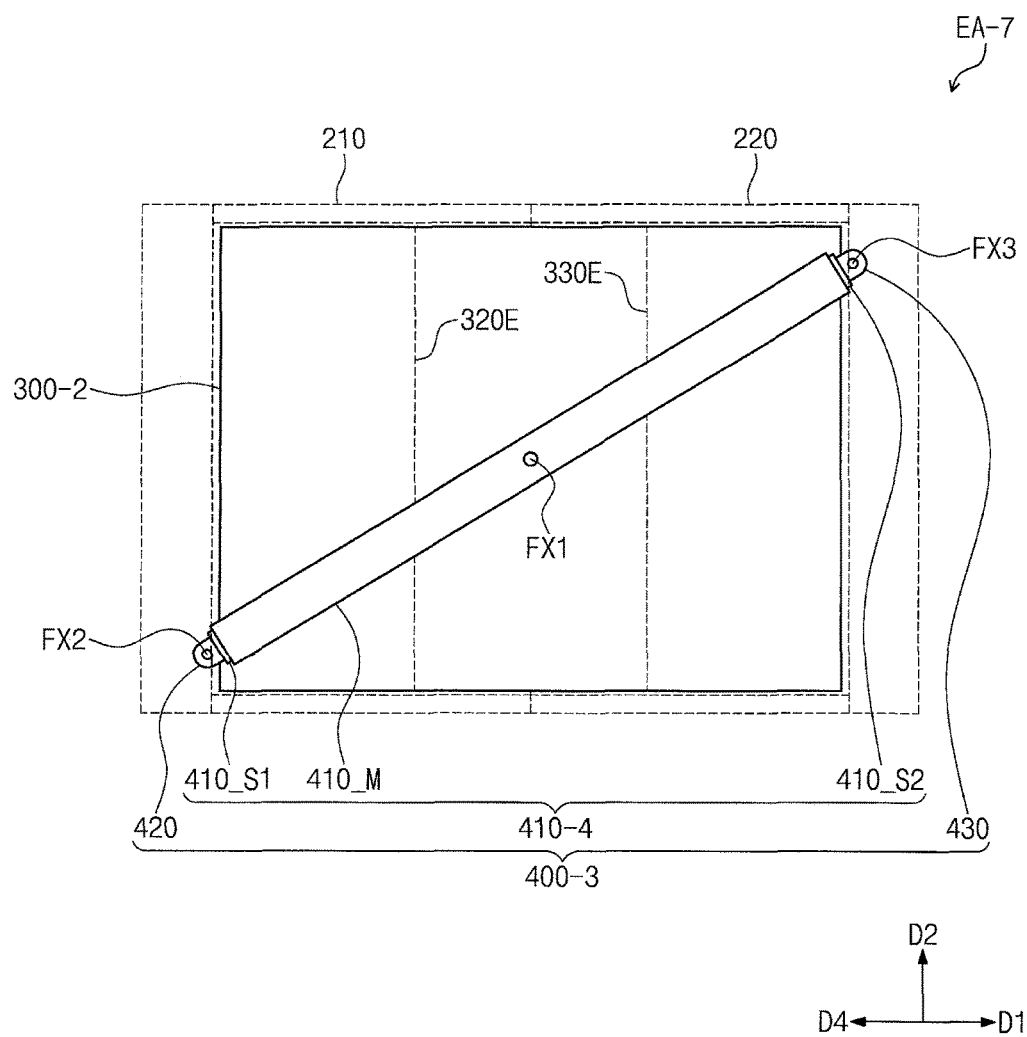
FIGS. 13A and 13B are plan views of an electronic device according to some embodiments of the inventive concept.
Figure 13B:
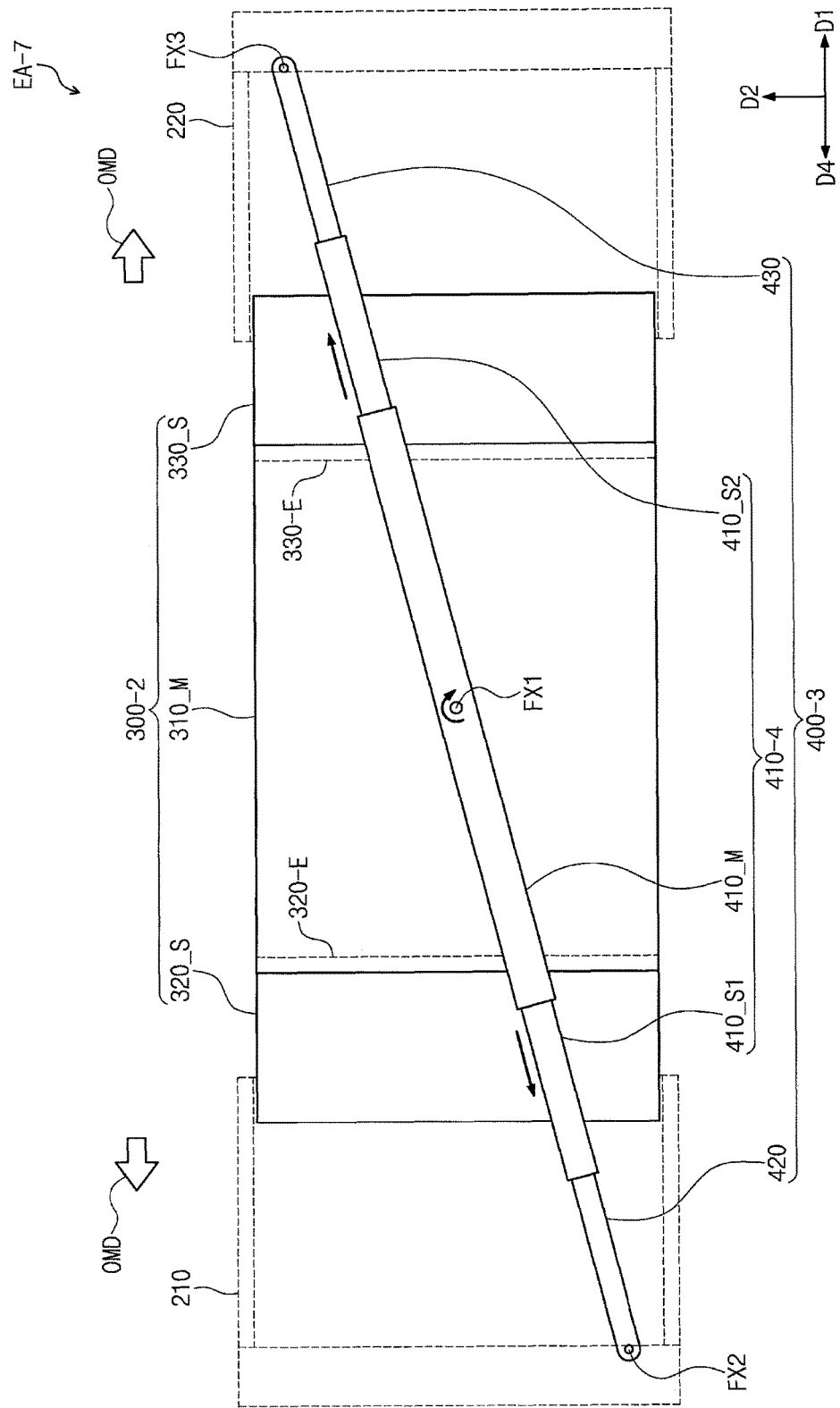

FIGS. 13A and 13B are plan views of an electronic device according to some embodiments of the inventive concept. FIG. 13A illustrates a plan view of an electronic device EA-7 in the first mode, and FIG. 13B illustrates a plan view of the electronic device EA-7 in the second mode.

For convenience in illustration, in FIGS. 13A and 13B, a fastening member 300-2 and a hinge unit 400-3 are depicted by solid lines, the first and second case members 210 and 220 are depicted by dotted lines, and the electronic panel 100 (e.g., see FIG. 1) is not depicted. Hereinafter, the electronic device EA-7 according to some embodiments of the inventive concept will be described with reference to FIGS. 13A and 13B. For concise description, an element previously described with reference to FIGS. 1A to 12B may be identified by a similar or identical reference number without repeating an overlapping description thereof.

As shown in FIGS. 13A and 13B, the fastening member 300-2 of the electronic device EA-7 may include a plurality of portions. In the present embodiment, the fastening member 300-2 may include a middle portion 310_M, a first side portion 320_S, and a second side portion 330_S.

The middle portion 310_M may be a portion to which the hinge unit 400-3 is fastened. In the present embodiment, the hinge unit 400-3 may be coupled to the middle portion 310_M by the first coupling member FX1.

The middle portion 310_M may have an area corresponding to the first active region AA1 (e.g., see FIG. 1A) of the electronic panel 100 that is activated in the first mode. In the first mode, the middle portion 310_M may be enclosed by, or framed by, the first and second case members 210 and 220.

In the first mode, the first and second side portions 320_S and 330_S may be arranged to entirely overlap the middle portion 310_M. Accordingly, when viewed in a plan view, a side 320E of the first side portion 320_S and a side 330E of the second side portion 330_S may overlap the middle portion 310_M while facing each other in the first direction D1 or the fourth direction D4.

In the present embodiment, each of the first and second side portions 320_S and 330_S is illustrated to have an area smaller than half that of the middle portion 310_M. However, the inventive concept is not limited to the above examples, and each of the first and second side portions 320_S and 330_S may have an area corresponding to half that of the middle portion 310_M. That is, in the first mode, the side 320-E of the first side portion 320_S may be in contact with the side 330-E of the second side portion 330_S.

In the second mode, the first and second side portions 320_S and 330_S may be moved outwardly from the middle portion 310_M through the linear motion OMD to not be veiled by the middle portion 310_M. Thus, a length of the fastening member 300-2 in an extension direction of the linear motion OMD may be increased, and consequently, the fastening member 300-2 may have an increased area corresponding to that of the active region FAA (e.g., see: FIG. 1B) of the electronic device EA in the second mode.

The hinge unit 400-3 may include a plurality of portions (e.g., a body member 410-4, a first moving member 420, and a second moving member 430). The first and second moving members 420 and 430 may be configured to have substantially the same features as the first and second moving members 420 and 430 shown in FIGS. 5A and 5B, and a detailed description thereof will be omitted.

The body member 410-4 may include a middle portion 410_M, a first extendable portion 410_S1, and a second extendable portion 410_S2. The middle portion 410_M may be a rod-shaped structure extending in a diagonal direction of the middle portion 310_M of the fastening member 300-2 and may be pierced by the first coupling member FX1. The middle portion 410_M may correspond to the body member 410 (e.g., see FIG. 5A) of FIGS. 5A and 5B.

The first and second extendable portions 410_S1 and 410_S2 may be respectively connected to two opposite ends of the middle portion 410_M. The first and second extendable portions 410_S1 and 410_S2 may be configured to be extendable from respective ends of the middle portion 410_M.

The first extendable portion 410_S1 may be provided between the middle portion 410_M and the first moving member 420, may be inserted into the middle portion 410_M in the first mode, and may be extracted from the middle portion 410_M in the second mode. Here, the first moving member 420 may be inserted into the first extendable portion 410_S1 in the first mode and may be extracted from the first extendable portion 410_S1 in the second mode.

Similarly, the second extendable portion 410_S2 may be provided between the middle portion 410_M and the second moving member 430, may be inserted into the middle portion 410_M in the first mode, and may be extracted from the middle portion 410_M in the second mode. Here, the second moving member 430 may be inserted into the second extendable portion 410_S2 in the first mode and may be extracted from the second extendable portion 410_S2 in the second mode.

Both of the first extendable portion 410_S1 and the first moving member 420 may be inserted into the middle portion 410_M in the first mode, and may be extracted from the middle portion 410_M in the second mode. Also, both of the second extendable portion 410_S2 and the second moving member 430 may be inserted into the middle portion 410_M in the first mode and may be extracted from the middle portion 410_M in the second mode.

According to some embodiments of the inventive concept, the hinge unit 400-3 may include the body member 410-4 that can be extended depending on its operation mode. Accordingly, it may be possible to further increase a planar area of an active region of the electronic device EA-7 in the second mode. Furthermore, it may be possible to easily and variously change the planar area of the active region of the electronic device EA-7 to be provided to a user. In addition, it may be possible to relieve technical restrictions on the planar area of the active region, and this may make it possible to apply the electronic device to various products.

According to some embodiments of the inventive concept, an electronic device may include a hinge unit with a body member and moving members. The body member may be configured to be rotatable about a fixed rotating axis, when viewed in a plan view, and each of the moving members may be configured to perform a linear motion. Accordingly, when an operation mode of the electronic device is changed to provide different active regions, it may be possible to easily control motions of components, and moreover to improve both of portability and expandability of, the electronic device.

While embodiments of the inventive concept have been particularly shown and described, it will be understood by one of ordinary skill in the art that variations in form and detail may be made therein without departing from the spirit and scope of the attached claims, with functional equivalents thereof to be included.

What is claimed is:

1. An electronic device, comprising:
a flexible display member;
a fastening member having a plane defined by a first direction and a second direction crossing the first direction and overlapping the display member in a plan view;
a housing unit comprising a first case member and a second case member configured to contain respective opposite portions of the display member; and
a hinge unit comprising:
a body member coupled to the fastening member to be rotatable in the plan view;
a first moving member connecting a portion of the body member to the first case member; and
a second moving member connecting an opposite portion of the body member to the second case member,
wherein the hinge unit is disposed between the flexible display member and the fastening member.

2. The electronic device of claim 1, wherein the display member is configured to display an image on a first region in a first mode, and on a second region in a second mode,
wherein the first mode and the second mode are respectively performed in different operation periods, and
wherein the first region and the second region are different from each other in their areas.

3. The electronic device of claim 2, wherein, when the electronic device is changed from the first mode to the second mode, or when the electronic device is changed from the second mode to the first mode, the body member is configured to perform a rotational motion in the plan view, and each of the first case member and the second case member is configured to perform a linear motion in the plan view.

4. The electronic device of claim 3, wherein the first case member and the second case member are configured to perform symmetric motions.

5. The electronic device of claim 3, wherein, when the electronic device is changed from the first mode to the second mode, or when the electronic device is changed from the second mode to the first mode, each of the first moving member and the second moving member is configured to perform a linear motion in a direction that crosses a direction of the linear motion of each of the first case member and the second case member in the plan view.

6. The electronic device of claim 5, wherein the body member is a rod-shaped structure extending in an extending direction, and
the direction of the linear motion of each of the first moving member and the second moving member is parallel to the extending direction.

7. The electronic device of claim 6, wherein the linear motion of each of the first moving member and the second moving member is configured to be performed in a stepwise manner.

8. The electronic device of claim 5, wherein the body member has a length that is extendable depending on an operation mode of the electronic device.

9. The electronic device of claim 3, further comprising:
a first coupling member coupling the body member to the fastening member;
a second coupling member coupling the first moving member to the first case member; and
a third coupling member coupling the second moving member to the second case member,
wherein the body member has a rotating axis passing through the first coupling member.

10. The electronic device of claim 9, further comprising:
a first sub-coupling member coupling the first moving member to the body member; and
a second sub-coupling member coupling the second moving member to the body member,
wherein, in the plan view, the first sub-coupling member and the second sub-coupling member are configured to perform respective motions depending on whether the electronic device is in the first mode or in the second mode.

11. The electronic device of claim 10, wherein the motions of the first sub-coupling member and the second sub-coupling member are performed to respectively change an angle between the first moving member and the body member at the first sub-coupling member and an angle between the second moving member and the body member at the second sub-coupling member.

12. The electronic device of claim 1, wherein the hinge unit comprises a first hinge unit and a second hinge unit, each of which is coupled to the fastening member, and which are arranged to cross each other, and
wherein the first hinge unit and the second hinge unit have respective body members that are configured to perform rotational motions about a common axis.

13. An electronic device, comprising:
an electronic panel configured to activate a first region in a first mode and a second region in a second mode, the second region having an area that is larger than that of the first region;
a fastening member having a plane defined by a first direction and a second direction crossing the first direction and overlapping the electronic panel in a plan view;
a housing unit configured to contain the electronic panel and the fastening member, and comprising a first case member and a second case member, each of which is configured to perform a linear motion; and
a hinge unit comprising a body member, a first moving member, and a second moving member, the body member being fastened to the fastening member and being configured to perform a rotational motion in the plan view, the first moving member connecting a portion of the body member to the first case member, and
a second moving member connecting an opposite portion of the body member to the second case member,
wherein the hinge unit is disposed between the electronic panel and the fastening member, and
wherein the first case member and the second case member are configured such that the linear motions thereof are symmetric about the fastening member in the plan view.

14. The electronic device of claim 13, wherein, when the electronic device is changed from the first mode to the second mode, the body member is configured to perform a rotational motion in a clockwise direction in the plan view, the first moving member is configured to perform a linear motion in an extension direction of the body member, and the second moving member is configured to perform a linear motion in a direction that is opposite to the extension direction.

15. The electronic device of claim 14, wherein the extension direction of the body member is at an angle to a direction of the linear motion of each of the first case member and the second case member.

16. The electronic device of claim 13, further comprising:
a first coupling member coupling the body member to the fastening member;
a second coupling member coupling the body member to the first case member; and
a third coupling member coupling the body member to the second case member,
wherein the first coupling member comprises a gear portion having a saw-tooth structure, and
wherein each of the first moving member and the second moving member comprises protruding portions that are configured to be fittingly engaged with the gear portion.

17. The electronic device of claim 13, further comprising:
a first sub-coupling member coupling the portion of the body member to the first moving member; and
a second sub-coupling member coupling the opposite portion of the body member to the second moving member,
wherein, in the plan view, a position of each of the first sub-coupling member and the second sub-coupling member in the first mode is different from that in the second mode.

18. The electronic device of claim 13, wherein, in the first mode:
all of the fastening member, the first case member, and the second case member overlap each other in the first mode in the plan view; and
the first region overlaps all of the fastening member, the first case member, and the second case member in the plan view.

19. An electronic device, comprising:
a flexible electronic panel;

a fastening member having a plane defined by a first direction and a second direction crossing the first direction and overlapping the electronic panel in a plan view;

a housing unit comprising a first case member and a second case member that are configured to contain respective opposite portions of the electronic panel; and a hinge unit comprising a body member, a first moving member, and a second moving member, wherein the body member is coupled to the fastening member to be rotatable in the plan view, the first moving member is slidably coupled to a portion of the body member and is fixedly coupled to the first case member, and the second moving member is slidably coupled to an opposite portion of the body member and is fixedly coupled to the second case member, wherein the hinge unit is disposed between the electronic panel and the fastening member.

20. The electronic device of claim 19, wherein the body member is extendable in an extension direction, and wherein each of the first moving member and the second moving member is configured to perform a linear motion in the extension direction.

\* \* \* \* \*